United States Patent [19]

Anami

[11] Patent Number: 5,276,652
[45] Date of Patent: Jan. 4, 1994

[54] STATIC RANDOM ACCESS MEMORY INCLUDING A SIMPLIFIED MEMORY CELL CIRCUIT HAVING A REDUCED POWER CONSUMPTION

[75] Inventor: Kenji Anami, Hyogo, Japan

[73] Assignee: Mitsubishi Denki Kabushiki Kaisha, Tokyo, Japan

[21] Appl. No.: 943,648

[22] Filed: Sep. 11, 1992

[30] Foreign Application Priority Data

Sep. 20, 1991 [JP] Japan ................................. 3-242088
Sep. 7, 1992 [JP] Japan ................................. 4-238547

[51] Int. Cl.⁵ .............................................. G11C 11/34
[52] U.S. Cl. ..................................... 365/227; 365/226
[58] Field of Search ............ 365/226, 227, 229, 189.01

[56] References Cited

U.S. PATENT DOCUMENTS

| | | | |
|---|---|---|---|
| 4,409,679 | 10/1983 | Kurafuji et al. | 365/227 |
| 4,751,683 | 6/1988 | Wada et al. | 365/227 |
| 4,760,582 | 7/1988 | Ohtani | 365/227 |
| 4,768,166 | 8/1988 | Anami | 365/154 |
| 5,046,052 | 9/1991 | Miyaji et al. | 365/227 |
| 5,140,557 | 8/1992 | Yoshida | 365/227 |

FOREIGN PATENT DOCUMENTS

| | | | |
|---|---|---|---|
| 56-16995 | 2/1981 | Japan | 365/227 |
| 56-143587 | 11/1981 | Japan . | |
| 59-90290 | 5/1984 | Japan | 365/227 |
| 61-24092 | 2/1986 | Japan . | |
| 61-26997 | 2/1986 | Japan . | |
| 3-44892 | 2/1991 | Japan | 365/227 |

OTHER PUBLICATIONS

"New Bit Line Architecture for Ultra High Speed SRAMS", Shiomi et al., IEEE 1991, pp. 10.4.1–10.4.4.
"THAM 9.4:16K CMOS/SOS Asynchronous Static RAM", 1979 IEEE International Solid-State Circuits Conference, pp. 104–105, 286.

Primary Examiner—Eugene R. LaRoche
Assistant Examiner—Tan Nguyen
Attorney, Agent, or Firm—Lowe, Price, LeBlanc & Becker

[57] ABSTRACT

A static random access memory includes a plurality of memory cells each constituted by 5 elements. One memory cell is connected to a single bit line through a single access gate transistor. Additionally, a source line potential controlling circuit is provided for applying a predetermined intermediate potential to the source of a driver transistor of the memory cell in a column which is not accessed, when the memory cell is not accessed. Since one memory cell is constituted by only five elements, and connected to a single bit line, its density is improved. Furthermore, since a power supply voltage applied to the memory cell provided in the column which is not accessed is decreased by an effect of a source line potential controlling circuit, power consumption is decreased, and moreover, destruction of the memory cell can be prevented.

26 Claims, 18 Drawing Sheets

STATIC RANDOM ACCESS MEMORY INCLUDING A SIMPLIFIED MEMORY CELL CIRCUIT HAVING A REDUCED POWER CONSUMPTION

BACKGROUND OF THE INVENTION

1. Field of the Invention

The present invention generally relates to static random access memory devices and, more particularly to a high integrated and less power consuming static random access memory device.

2. Description of the Background Art

Generally, a static random access memory is used in various electronic equipments such as a computer. Less power consumption and high degree of integration are more increasingly required in the semiconductor memory as the function of those equipments improves.

FIG. 16 is a circuit diagram of a memory cell circuit and a source potential controlling circuit in a conventional SRAM. The circuit shown in FIG. 16 is disclosed in Japanese Patent Laying-Open No. 56-143587 (corresponding to U.S. Pat. No. 4,409,679). Referring to FIG. 16, one memory cell MA includes NMOS transistors QB5 and QB6, and resistances R1 and R2 constituting a data storage circuit, and NMOS transistors QB3 and QB4 as access gates. Transistors QB3 and QB4 have their gates connected to a word line WL. The sources of transistors QB5 and QB6 are connected to a source potential controlling circuit 8z through a source line SL.

Source potential controlling circuit 8z includes NMOS transistors QB7, QB8, QB9, and QB10 for generating a predetermined intermediate potential and resistors R3 and R4. An output node No of an intermediate potential generating circuit is connected to source line SL. An NMOS transistor QB11 is connected between output node No and ground. Transistor QB11 have the gate connected to receive a column selection signal Y provided from a column decoder (not shown). Bit lines B1 and B2 are connected to an IO line (not shown) through NMOS transistors QB12 and QB13 constituting a Y gate circuit.

In operation, when a column shown in FIG. 16 is selected, a high level column selection signal Y is applied from a column decoder (not shown). Accordingly, transistors QB11, QB12, and QB13 turn on. When transistor QB11 turns on, a power supply potential VDD and a ground potential VSS are applied to a memory cell MA as a power supply voltage. Additionally, when word line WL attains a high level, transistors QB3 and QB4 turn on. As a result, bit lines B1 and B2 are driven by transistors QB5 and QB6, respectively, in response to a stored data signal.

When the column shown in FIG. 16 is not selected, column selection signal Y attains a low level. Therefore, transistors QB11, QB12, and QB13 turn off. When transistor QB11 turns off, an intermediate potential between VDD and VSS provided from source line potential controlling circuit 8Z is applied to the sources of transistors QB5 and QB6 through source line SL. Consequently, the power supply consumed in the memory cells of the non-selected column is decreased.

Memory cell MA shown in FIG. 16 is constituted by 6 elements. A wide region is needed on a semiconductor substrate in order to form these 6 elements. A certain area on the substrate is occupied in order to form two transistors QB3 and QB4, particularly needed as the access gates. Additionally, since two bit lines B1 and B2, and source line SL are needed in each column, the space between interconnections in the column direction is narrow. This is an obstacle to the improvement of the degree of integration. This means that in SRAM shown in FIG. 16, in particular, the interconnection formed in the column direction becomes dense, since source line SL is needed in each column in addition to two lines B1 and B2.

SRAM including the memory cells each constituted by five elements is known to decrease the region occupied by the memory cells on the semiconductor substrate. Memory cell circuits shown in FIGS. 17, 18, and 19 show conventional examples of such SRAM. These are disclosed in Japanese Patent Laying-Open Nos. 61-24092 and/or 61-26997.

FIG. 17 is a circuit diagram of a conventional SRAM including the memory cells each constituted by five elements. Referring to FIG. 17, the SRAM includes memory cells MB1 to MB4, each constituted by three NMOS transistors and two resistances. Sources of driver transistors in memory cells MB1 and MB2 provided in kth column are connected to a write line WRk. Access transistors are connected to a bit line BLk. Memory cells MB3 and MB4 provided in k+1st column are connected to a write line WRk+1 and a bit line BLk+1 in the same manner.

The purpose of write lines WRk and WRk+1 being provided in SRAM shown in FIG. 17 is to apply a power supply potential VDD to the memory cells through the write lines in write operation. Power supply voltage VDD for data writing operation is applied through the write lines to a column where data is to be written in, namely, memory cells in a column which is to be accessed. In read operation, the write line is maintained at a ground potential Vss. It should be clear that the purpose of controlling the voltages of the write lines is not to decrease power consumption in the memory cells.

SRAM is improved as shown in FIG. 18 in order to prevent possible malfunction in SRAM shown in FIG. 17. In addition to this, SRAM shown in FIG. 19 is proposed to improve the degree of integration of SRAM shown in FIG. 17. It should be clear that the write lines WRk, WRk+1, WRi, and WRi+1 are provided to SRAMs shown in FIGS. 18 and 19 in the same manner as the SRAM shown in FIG. 17 for carrying out write operation and not for decreasing power supply consumption in the memory circuits. As a result, these write lines are brought to power supply potential VDD in write operation, and brought to ground potential Vss in read operation.

In the conventional memory cells as mentioned above, it should be clear that the gate oxide film of NMOS transistor connected to the word line may easily be destroyed, in addition to the fact that much power consumption is in the memory cell circuit. This means that the power supply potential VDD and the ground potential Vss are applied as the power supply voltages to all of the memory cells even when SRAM is at an active state, that is, even when read or write operation is carried out in SRAM. As a result, the voltage of VDD-Vss is applied across the gates-source of the access transistor in a memory cell which is not accessed. When high degree of integration is advanced in SRAM, a gate oxide film becomes thin. Consequently, the gate oxide film has a tendency to be destroyed by the voltage applied across the gate-source. It is preferable that the voltage applied across the gate-source decreases in order to prevent destruction of the gate oxide film. However, in the conventional SRAM, the gate oxide film is destroyed as time passes since a constant power supply voltage is always applied to the memory cells. It should be noted that the failure rate as time passes of destruction of the gate oxide film is high.

SUMMARY OF THE INVENTION

One object of the present invention is to improve the degree of integration of a static random access memory under less power consumption.

Another object of the present invention is to prevent memory cells from being destroyed by an applied voltage in the progress of the high integration of a static random access memory.

In short, a static random access memory of the present invention includes a memory cell array including a plurality of memory cells arranged in rows and columns, and a plurality of bit lines each provided in corresponding one of the columns in the memory cell array and connected to the memory cells in corresponding one of the column. Each of the memory cells includes a data storage circuit storing a data signal applied through a signal input/output node, and a single switching element connected between the bit line in a corresponding column and the input/output node which is turned on in response to a row address signal. The data storage circuit is applied with a controllable power supply voltage. Additionally, the static random access memory includes a power supply voltage decreasing circuit selectively decreasing to a predetermined voltage value the power supply voltage applied to the memory cells in the column which is not accessed.

In operation, each of the memory cells arranged in one column is connected to corresponding one of the bit lines through the single switching element provided in each of the memory cells. Therefore, in comparison with the conventional one, integration level on the semiconductor substrate has been improved. Furthermore, power consumption is decreased and destruction of the memory cells can be prevented, since the power supply voltage decreasing circuit selectively decreases the power supply voltage applied to the memory cells in the column which is not accessed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
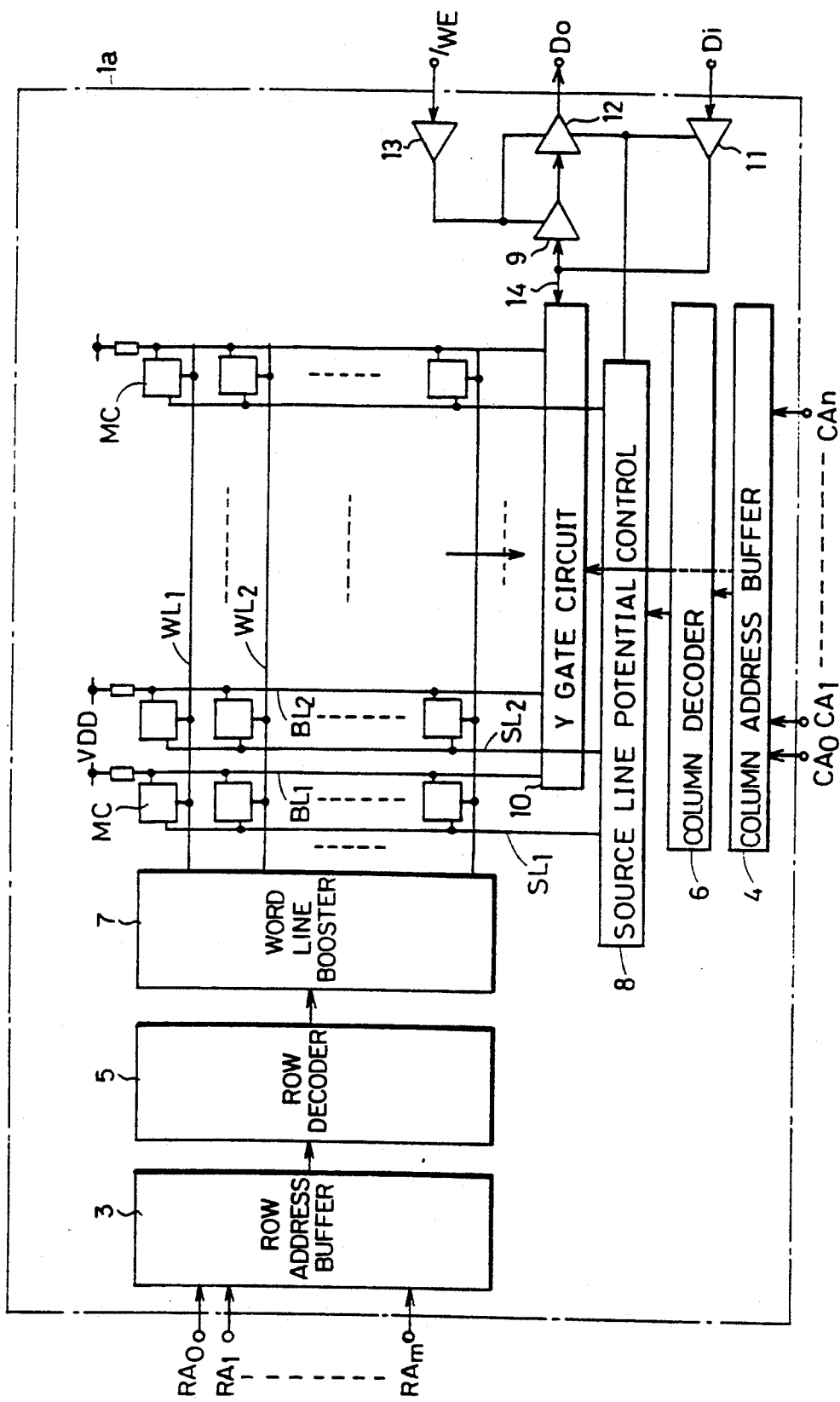
FIG. 2 is a block diagram of a SRAM showing one embodiment of the present invention.

Referring to FIG. 2, the SRAM 1a includes a row address buffer 3 supplied with row address signals RA0-RAm, a column address buffer 4 supplied with column address signals CA0 to CAn, a row address 5 decoding the row address signals and selectively activating a word line, a column decoder 6 decoding the column address signals and selecting a bit line, and a word line boosting circuit 7 boosting a potential of an activated word line. A plurality of memory cells MC are arranged in rows and columns on a semiconductor substrate and constitute a memory cell array. The memory cells arranged in one column are connected to a Y gate circuit 10 through corresponding one of the bit lines BL1, BL2, . . . The memory cells arranged in one column are connected to a source line potential controlling circuit 8 through corresponding one of the source lines SL1, SL2, ... The memory cells arranged in one row are connected to a word line boosting circuit 7 through corresponding one of the word lines WL1, WL2, ...

Bit lines BL1, BL2, ... are connected to a sense amplifier 9 through Y gate circuit 10 and an IO line 14. Y gate circuit 10 responsive to a column selection signal provided from column decoder 6 selectively connects one of the bit lines BL1, BL2, ... to line 14. Sense amplifier 9 is activated in response to a write enable signal /WE applied through an IO buffer 13. Accordingly, a data signal read from the memory cells is provided as an output data Do through an output buffer 12 after it is amplified by sense amplifier 9. A write data signal Di is applied to the memory cells through an IO buffer 11, IO line 14, and Y gate circuit 10.

Source line potential controlling circuit 8 responsive to column address signals CA0 to CAn applied through column address buffer 4 brings source lines SL1, SL2, ... of the non-selected columns to a predetermined intermediate potential. Source line potential controlling circuit 8 applies a ground potential Vss to one selection line provided in a column selected by column address signals CA0 to CAn.

Figure 1:
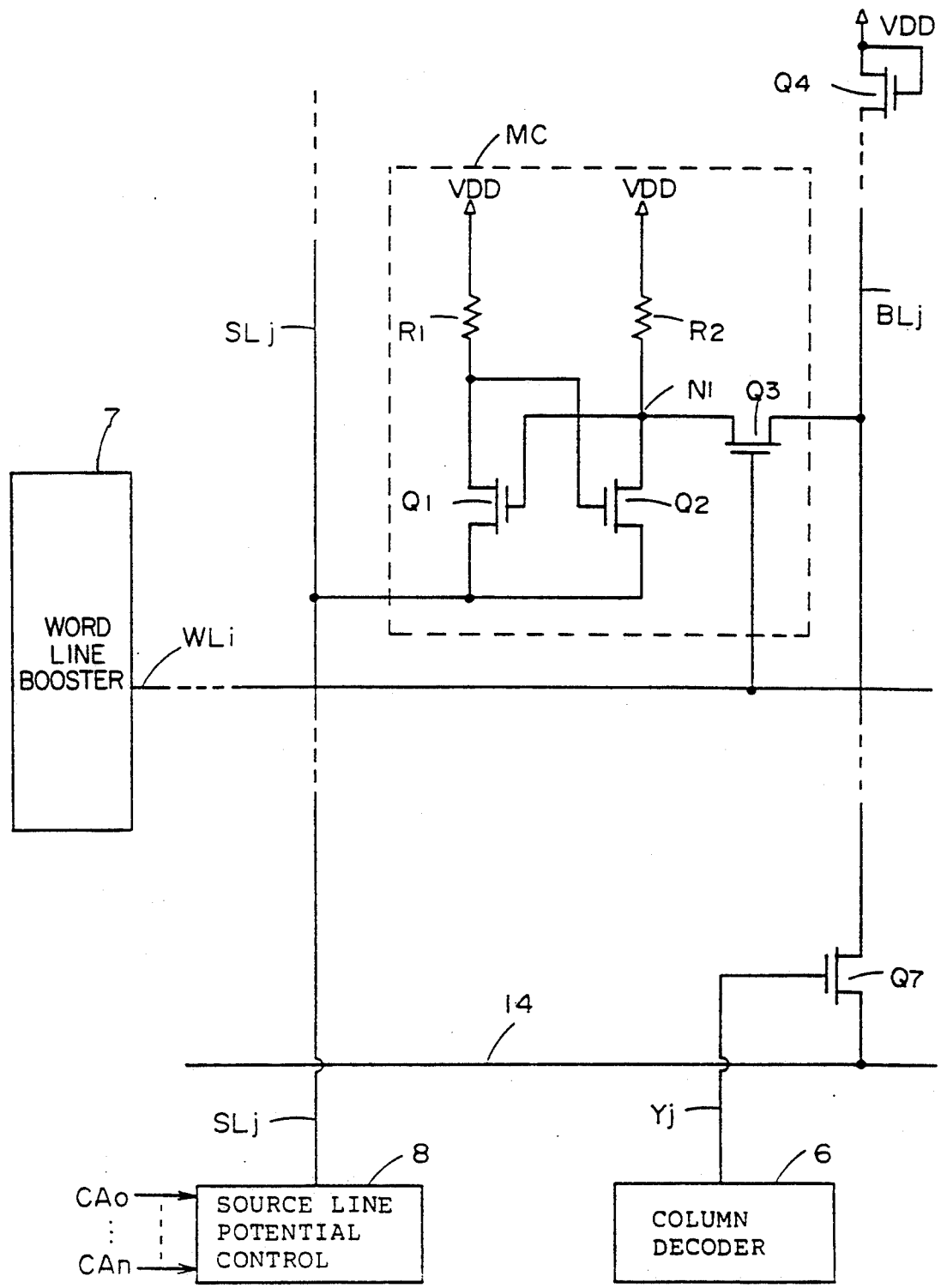
FIG. 1 is a circuit diagram of one of the memory cells shown in FIG. 2.

FIG. 1 is a circuit diagram of one of the memory cells MC shown in FIG. 2. Referring to FIG. 1, memory cell MC includes NMOS transistors Q1 and Q2 as driver transistors, resistances R1 and R2 as loads, and an NMOS transistor Q3 as an access gate. Transistor Q1 and resistance R1 constitute one inverter, while transistor Q2 and resistance R2 constitute another inverter. Therefore, a data storage circuit is constituted by two cross-coupled inverters. A common connection node N1 between transistor Q2 and resistance R2 constitutes a single input/output node of the data storage circuit. Transistor Q3 is connected between node N1 and a single bit line BL and operated in response to a signal on a word line WLi.

One end of bit line BL is connected to a power supply voltage VDD through a bit line load transistor Q4. The other end of bit line BL is connected to an IO line 14 through an NMOS transistor Q7 constituting Y gate circuit 10 shown in FIG. 2. Transistor Q7 is operated in response to a column selection signal Yj provided from column decoder 6. Access gate transistor Q3 is supplied with a word line signal boosted by word line boosting circuit 7 through a word line WLi.

The sources of driver transistors Q1 and Q2 are connected to a source line SLj. A source line potential controlling circuit 8 applies a predetermined intermediate potential or a ground potential Vss to the sources of driver transistors Q1 and Q2 in memory cell MC through source line SLj.

FIG. 1 shows only one memory cell MC, but it should be noted that other memory cells also have the same circuit connection. Particularly, the memory cells provided in one column are commonly connected to a single bit line BLj and a single source line SLj.

Figure 3:
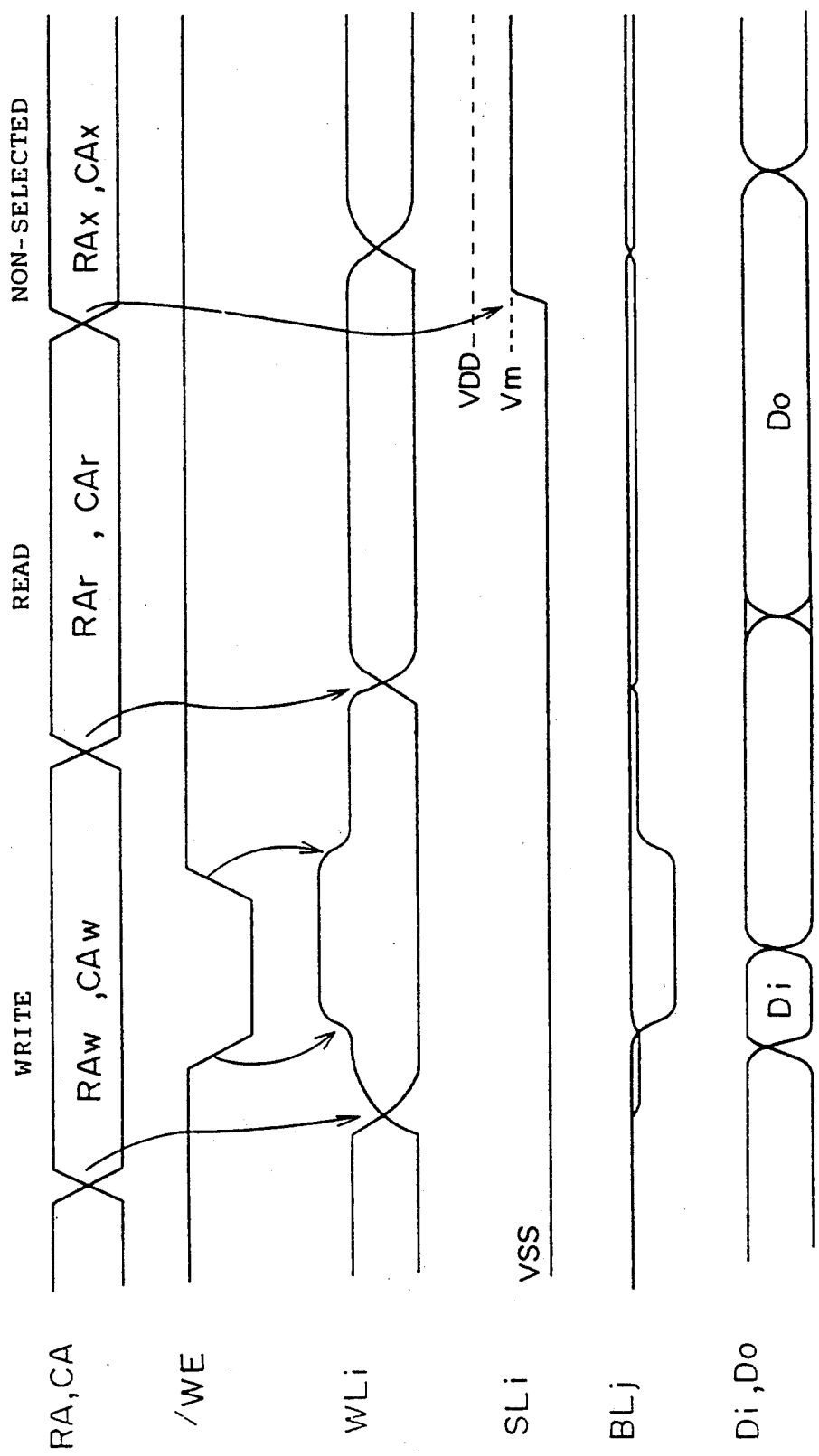
FIG. 3 is a timing chart for describing the operation of the memory cell circuit shown in FIG. 1.

FIG. 3 is a timing chart for describing an operation of a memory cell circuit shown in FIG. 1. Referring to FIGS. 1 and 3, a write enable signal /WE falls in write operation. Word line WLi in a row selected by a row address signal RAw for write operation attains a high potential boosted by word line boosting circuit 7 shown in FIG. 2. Source line SLj in a column selected by a column address signal CAw for write operation is brought to a ground potential Vss by source line potential controlling circuit 8. Additionally, bit line BLj selected by column address signal CAw attains either a high potential or a low potential in response to an input data signal Di which is to be written into the memory cell. Accordingly, access gate transistor Q3 further conducts current between bit line BLj and node N1 (i.e. it turns on with lower on resistance), and thus a data signal on bit line BLj is applied to the data storage circuit through IO node N1. The state of the data storage circuit is determined by an applied data signal.

In read operation, word line WLi selected by a row address signal RAr for read operation is brought to a high level. Therefore, transistor Q3 turns on, and a potential of bit line BLj slightly changes. Transistor Q7 turns on when column decoder 6 applies a high level column selection signal Yj to the gate of transistor Q7 in response to a column address signal CAr for read operation. As a result, a potential change appeared on bit line BLj is applied to sense amplifier 9 shown in FIG. 2 through transistor Q7 and IO line 14. A data signal amplified by sense amplifier 9 is provided as an output data Do through output buffer 12.

As mentioned above, source line SLj in the column where writing or reading operation is carried out is held at a ground potential Vss in writing and reading period. That is, ground potential Vss is applied to source line SLj provided in one column which is to be accessed by source line potential controlling circuit 8. This means that the potential difference determined by power supply potential VDD and ground potential Vss is applied to the memory cells connected to source line SLj as a power supply voltage. That is, the power supply voltage of VDD - Vss is applied to the memory cells in the column which is accessed.

When memory cells provided in other column (not shown) which is different from the column shown in FIG. 1 is accessed, source line SLj of a column which is not accessed is brought to a predetermined intermediate potential Vm (e.g. Vm = VDD/2) between power supply potential VDD and ground potential Vss. Source line potential controlling circuit 8 responsive to a column address signal CAx applies intermediate potential Vm to source line SLj in a column where writing or reading operation is not carried out. This means that the potential difference between VDD - Vm is applied as the power supply voltage of memory cells MC. Because the value of the power supply voltage is decreased by Vm, the power consumed by the memory cells provided in a column which is not accessed is decreased.

It should be clear that the voltage applied across the gate-source of access gate transistor Q3 is decreased by the decrease of the power supply voltage. The gate oxide film becomes thin as the degree of integration improves. However, it is prevented from being destroyed by the applied voltage, because the voltage applied to the gate oxide film of transistor Q3 is decreased. This means that the failure rate as time passes of memory cell MC will be low.

Figure 4:
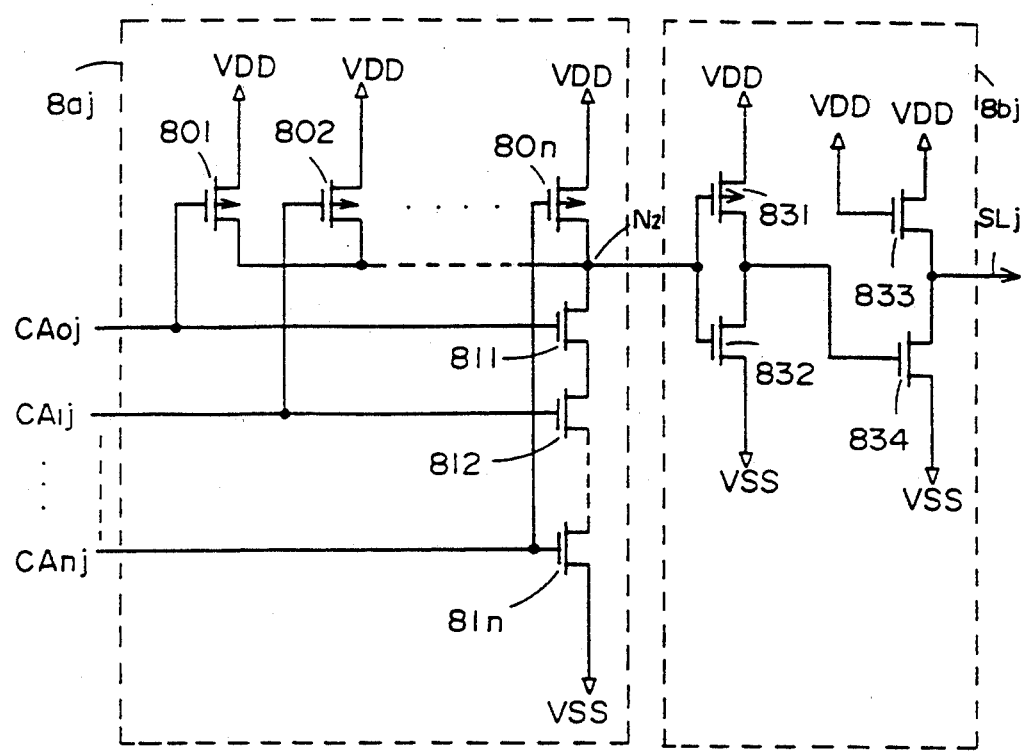
FIG. 4 is a partial circuit diagram showing one example of a source line potential controlling circuit shown in FIG. 2.

FIG. 4 is a partial circuit diagram shown in one example of the source line potential controlling circuits shown in FIG. 2. The circuits shown in FIG. 4 corresponds to the part provided for controlling a potential of jth source line Sj. A decoder circuit 8aj includes PMOS transistors 801 to 80n connected in parallel between a power supply voltage VDD and an output node N2, and NMOS transistors 811 to 81n connected in series between node N2 and a ground potential Vss. Transistors 801 to 80n have their gates respectively connected to receive column address signals CA0j to CAnj are inverted, or not inverted according to a predetermined rule. Similarly, transistors 811 to 81n have their gates connected to receive changed column address signals CA0j to Canj, respectively. After externally applied column address signals CA0 to Can are changed according to a predetermined rule by a changing circuit not shown, they are applied to decoder circuit 8aj as changed column address signals CA0j to Canj.

When the memory cells in jth column are accessed, all of the changed column address signals CA0j to Canj attain a high level. As a result, all of the transistors 811 to 81n turn on, and a low level signal is applied to an output circuit 8bj through output node N2. Therefore, a PMOS transistor 831 and an NMOS transistor 834 in output circuit 8bj turn on, and source line Slj is brought to a ground potential Vss. As a result, the potential difference (VDD - Vss) is applied to the memory cells provided in jth column as a power supply voltage.

When the memory cells provided in jth column are not accessed, at least one of the transistors 811 to 81n turns off in response to the changed column address signals CA0j to Canj. Additionally, at least one of the transistors 801 to 80n turns on. A high level voltage is applied to output circuit 8bj through an output node N2. Because transistor 832 in output circuit 8bj turns on, transistor 834 turns off. As a result, the voltage (VDD - Vth) determined by a threshold voltage Vth of NMOS transistor 833 which is always turned on is applied to source line SLj as an intermediate potential Vm.

The value of intermediate potential Vm is set at a range where transistor Q3, which should not be turned on, does not turn on by mistake according to a relative potential difference between bit line BLj and node N1 shown in FIG. 1. As a matter of fact, the value of intermediate potential Vm is determined so as not to change data storage condition of a data storage circuit. For example, when 5 volt is applied as power supply potential VDD and 0 volt is applied as ground potential Vss, intermediate potential Vm is set at a range from 3.5 to 4.5 volt. Vm is set by threshold voltage Vth of transistor 833 in output circuit 8bj shown in FIG. 4.

Figure 5:
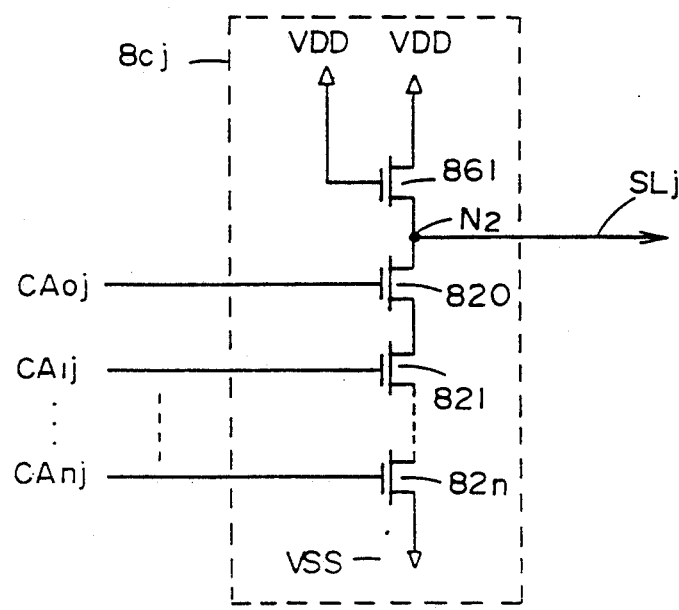
FIG. 5 is a partial circuit diagram showing another example of the source line potential controlling circuit shown in FIG. 2.
Figure 6:
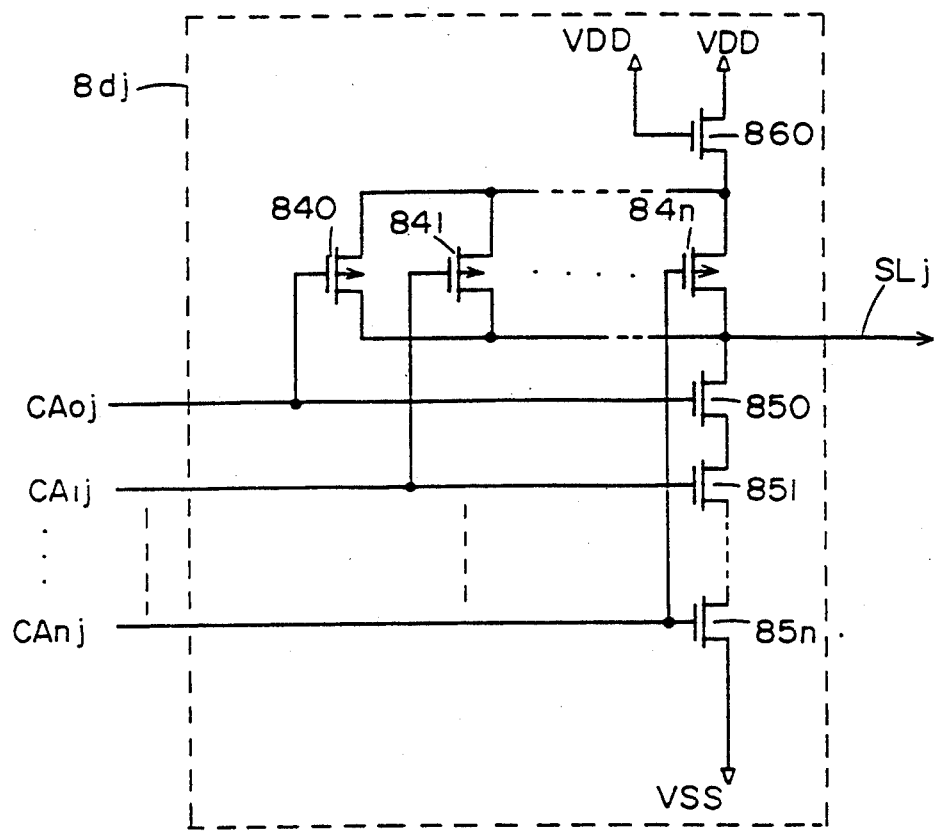
FIG. 6 is a partial circuit diagram showing yet another example of the source line potential controlling circuit shown in FIG. 2.

FIGS. 5 and 6 respectively shows other circuits applicable as a part of a source line potential controlling circuit 8 shown in FIG. 2. Referring to FIG. 5, a source line potential controlling circuit 8cj includes NMOS transistors 861, 820 to 82n connected in series between power supply potential VDD and ground potential Vss. Transistor 861 is always kept on, and by its threshold voltage, intermediate potential Vm is determined in the same manner as mentioned above. Since the operation of source line potential controlling circuit 8cj is the same as the circuit shown in FIG. 4, the description will not be repeated.

Referring to FIG. 6, a source line potential controlling circuit 8dj includes PMOS transistors 840 to 84n, and NMOS transistors 860, 850 to 85n. Since the operation of this circuit is also basically the same as the circuit 8aj shown in FIG. 4, the description will not be repeated.

Figure 8:
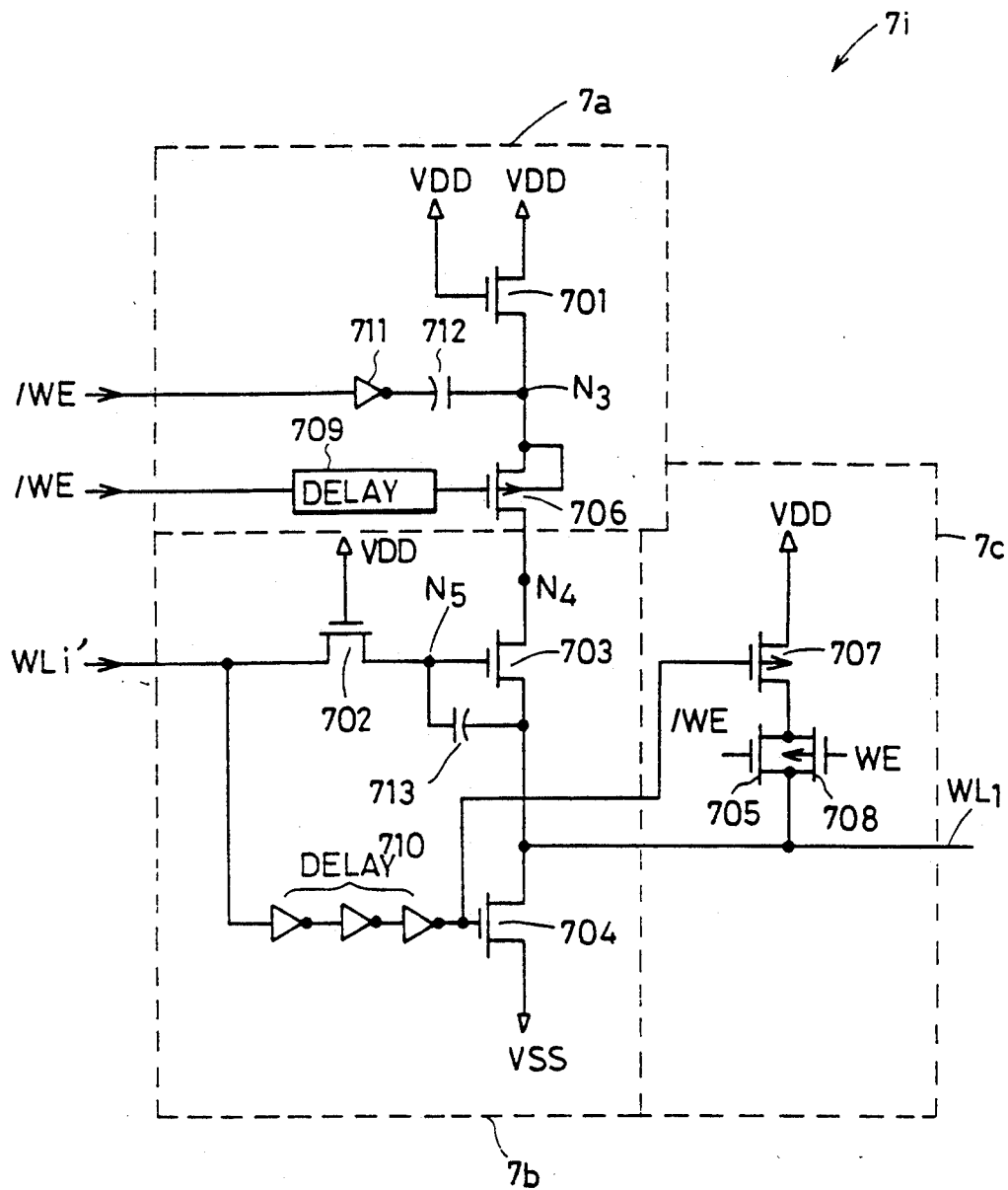
FIG. 8 is a partial circuit diagram of a word line boosting circuit shown in FIG. 2.

FIG. 8 is a partial circuit diagram of a word line boosting circuit 7 shown in FIG. 2. A word line boosting circuit 7i shown in FIG. 8 is provided to boost a voltage applied to an ith word line WLi. Referring to FIG. 8, boosting circuit 7i includes a boosted voltage generation circuit 7a responsive to an externally applied write enable signal /WE for generating a boosted voltage, a boosting buffer circuit 7b responsive to a signal WLi' applied from a row decoder (not shown) for transmitting the boosted voltage, and a switching circuit 7c responsive to the signal /WE for selectively outputting the boosted voltage or a power supply voltage VDD.

Since an NMOS transistor 701 is always kept on in write operation, a node N3 is brought to VDD - Vth (Vth is a threshold voltage of transistor 701) in advance. When a signal /WE changes from a high level (=VDD) to a low level (=Vss=0), the potential of node N3 attains approximately 2VDD - Vth by the coupling of a capacitor 712. Signal /WE is applied to the gate of a PMOS transistor 706 after having been delayed by a delay circuit 709. Accordingly, after node N3 attains voltage 2VDD - Vth, transistor 706 turns on. A node N4 is also brought to approximately 2VDD - Vth. When an input word line signal WLi' applied from a row decoder 5 (not shown) is changed from a low level to a high level (=VDD), the voltage of a node N5 attains VDD - Vth (the threshold voltage of a transistor 702 is referred to as Vth). Input word line signal WLi, is applied to the gate of an NMOS transistor 704 through a delay circuit 710 constituted by the inverters. Accordingly, after a time lapse determined by a delay circuit 710, transistor 704 turns off. Since the potential of node N5 rises by the coupling of a capacitor 713, an NMOS transistor 703 turns on at greater strength (it turns on at lower on resistance). As a result, a boosted voltage 2VDD - Vth is applied to word line WLi.

In read operation, a transmission gate constituted by two NMOS transistors 705 and 708 turn on in response to signals /WE and WE. NMOS transistor 704 and a PMOS transistor 707 turns on and off, respectively, since a high level (=VDD) input word line signal WLi' is applied. As a result, power supply potential VDD is applied to word line WLi.

Figure 9:
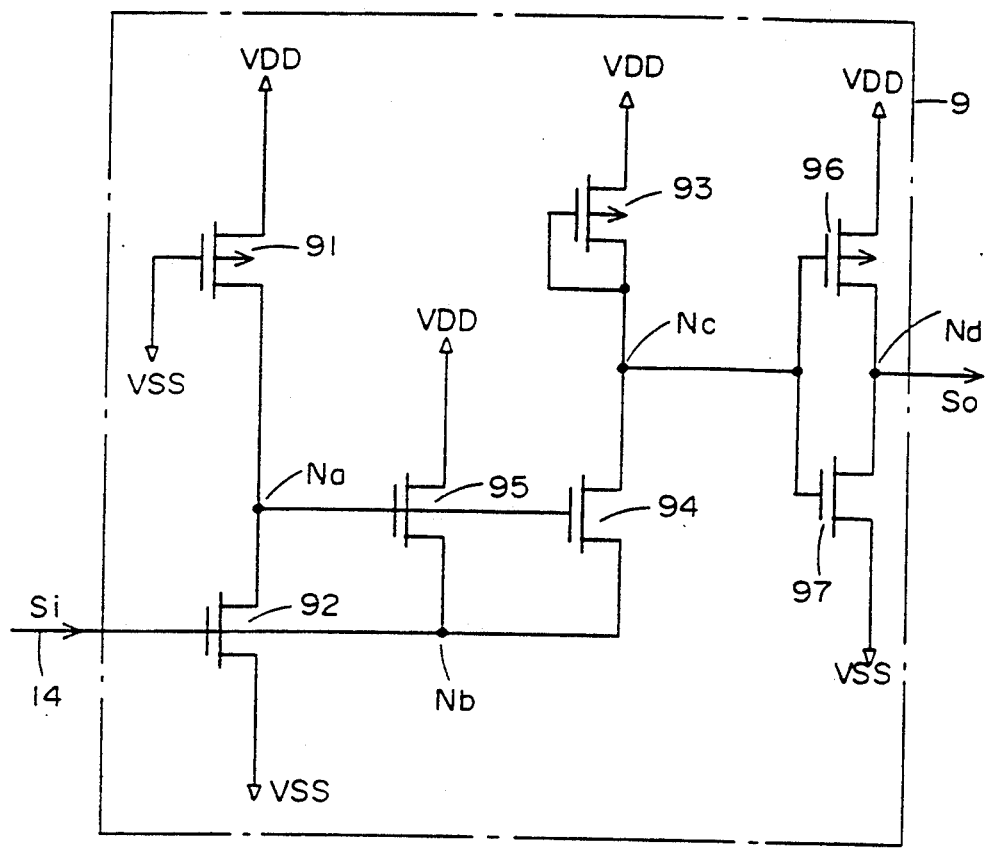
FIG. 9 is a circuit diagram of a sense amplifier shown in FIG. 2.
Figure 10:
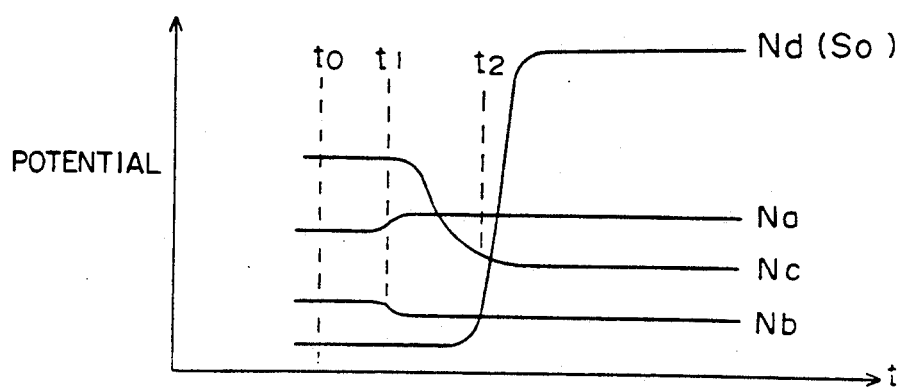
FIG. 10 is a timing chart for describing the operation of the sense amplifier shown in FIG. 9.

FIG. 9 is a circuit diagram of a sense amplifier 9 shown in FIG. 2. FIG. 10 is a timing chart for describing an operation of sense amplifier 9 shown in FIG. 9. Referring to FIG. 9, a signal Si read out from the memory cell is applied to the gate of a NMOS transistor 92 through an IO line 14. The potential of a node Na is held at a predetermined potential through a PMOS transistor 91 which is always kept on (at the time t0). Therefore, a node Nb is also held at another predetermined potential by an NMOS transistor 95 turned on in response to the potential of node Na.

At the time t1, the potential of an input signal Si slightly decreases in response to a read data signal. The potential of node Na rises because on resistance of transistor 92 increases. An NMOS transistor 94 is turned on at lower on resistance since the potential of the gate of transistor 94 rises. As a result, the potential of a node Nc drops by large amplitude (at the time t2). Since an inverter constituted by a PMOS transistor 96 and an NMOS transistor 97 inverts and amplifies a potential change of node Nc, an inverted signal is obtained as an output signal So.

Figure 11:
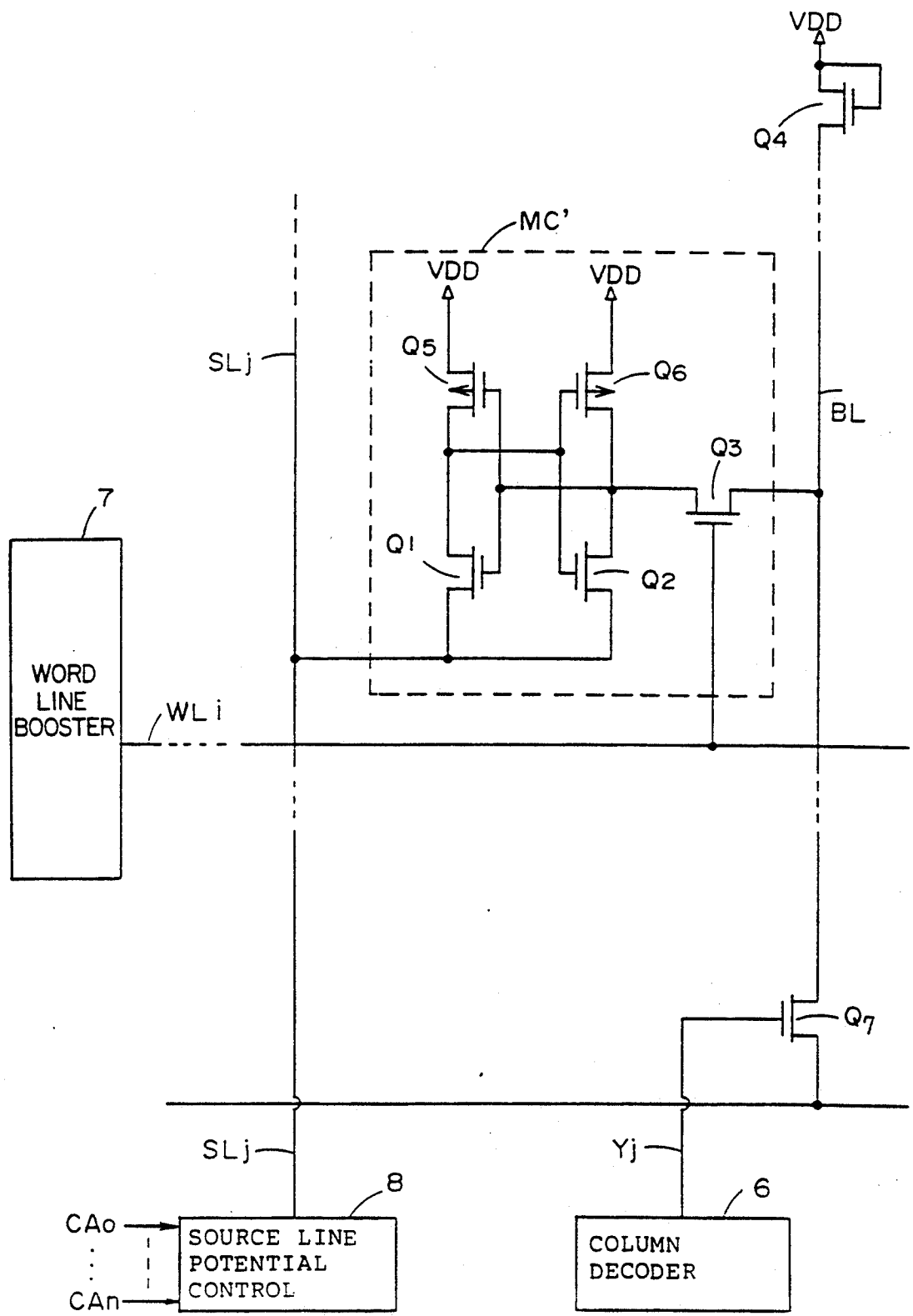
FIG. 11 is a circuit diagram of another memory cell applicable in the SRAM shown in FIG. 2.

FIG. 11 is a circuit diagram of another memory cell applicable in SRAM 1a shown in FIG. 2. Referring to FIG. 11, a memory cell MC' includes PMOS transistors Q5 and Q6 instead of resistance R1 and R2 as compared with the memory cell MC shown in FIG. 1. Transistors Q5 and Q6 are each formed of a Thin Film Transistor (hereinafter referred to as "TFT").

Figure 20:
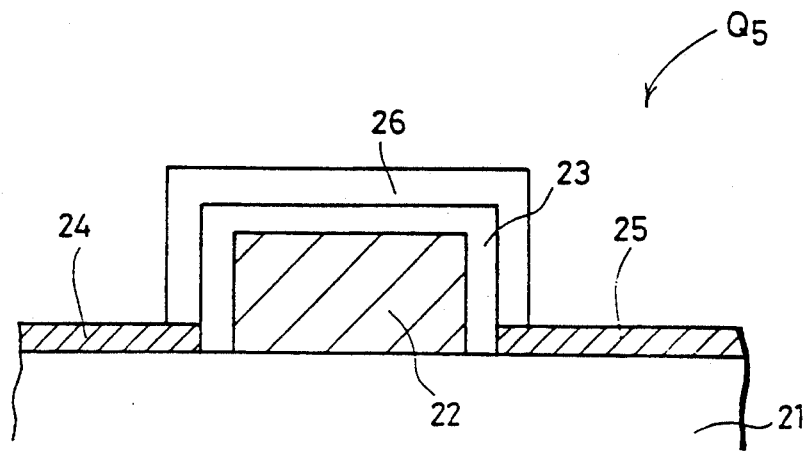
FIG. 20 is a cross sectional view showing a structure of a TFT Q5 used by a memory cell MC' shown in FIG. 11.

Referring to FIG. 20, one TFT Q5 includes a polycrystalline silicon layer 22 formed on an impurity-doped oxide film 21, a thermal oxide film 23 formed surrounding layer 22, thin film polycrystalline silicon 24, 25 formed on oxide film 21, and thin film polycrystalline silicon 26 formed surrounding thermal oxide film 23. Polycrystalline silicon layer 22 constitutes the gate electrode of TFT Q5. Thin film polycrystalline silicon 24 and 25 form the source electrode and the drain electrode of TFT Q5. Thin film polycrystalline silicon 26 functions as the channel region of TFT Q5. Thermal oxide film 23 is provided as the gate oxide film of TFT Q5.

Figure 12:
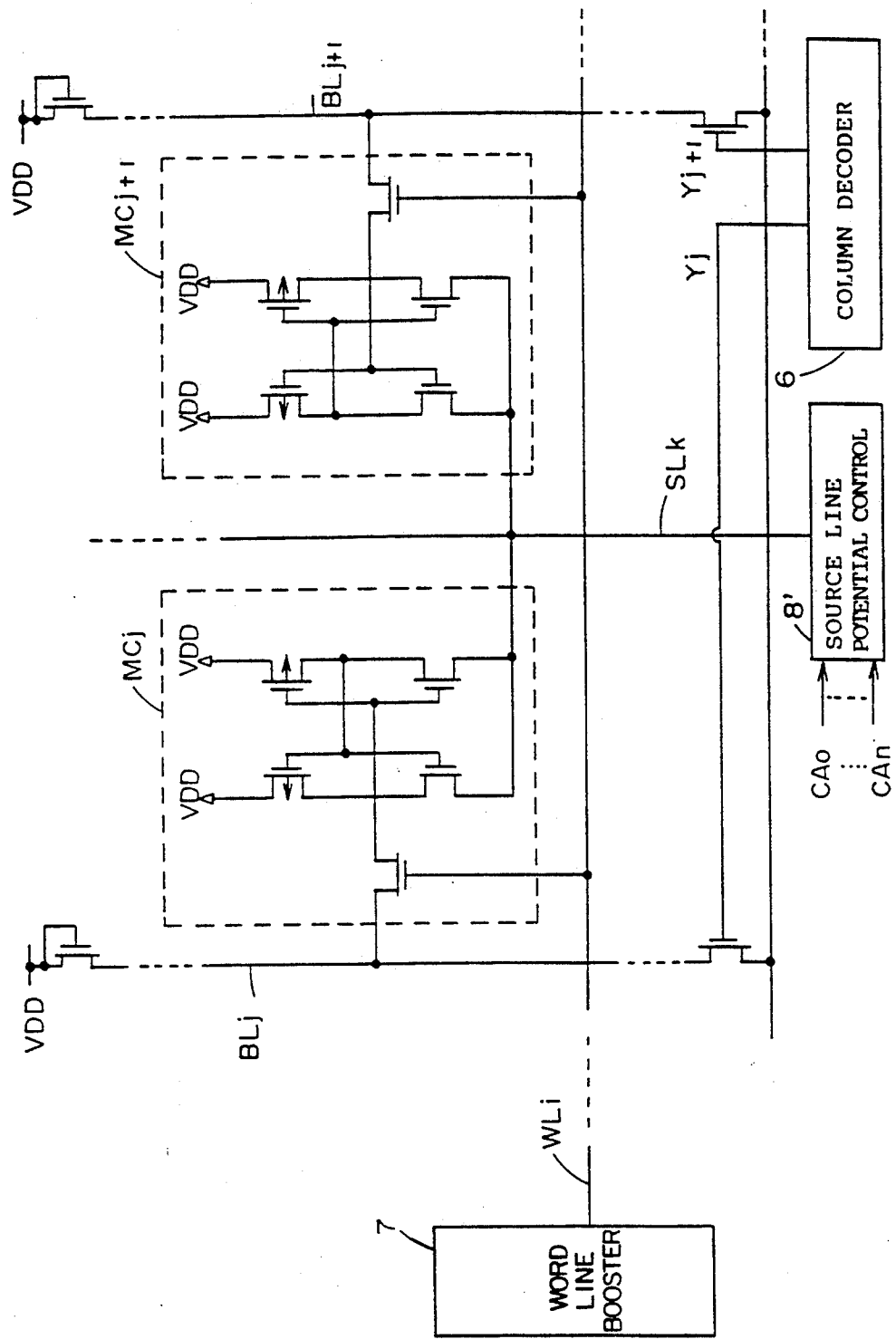
FIG. 12 is a circuit diagram of a memory cell showing another embodiment of the present invention.

FIG. 12 is a circuit diagram of a memory cell showing another embodiment of the present invention. FIG. 12 shows two memory cells MCj and MCj+1 respectively provided in the two adjacent columns. Memory cell MCj in jth column is connected to a bit line BLj. Memory cell MCj+1 provided in j+1th column is connected to a bit line BLj+1. In the circuit shown in FIG. 1, one source line SLj was provided in one column. However, in the circuit shown in FIG. 12, one source line SLk is provided for the two adjacent columns. Therefore, the sources of driver transistors in the two adjacent memory cells MCj and MCj+1 are commonly connected to source line SLk.

A source line potential controlling circuit 8' operates in response to column address signals CA0 to CAn. But its operation is slightly changed in comparison with the circuit 8 shown in FIG. 1. That is, when neither memory cell MCj in jth column nor memory cell MCj+1 in j+1 column is accessed, source line potential controlling circuit 8' applies intermediate potential Vm to source line SLk in response to column address signals CA0 to CAn. Therefore, a potential difference VDD - Vm is supplied two memory cells MCj and MCj+1 as a power supply voltage. As a result, the advantage of less power consumption and prevention of a gate oxide film can be obtained in the same manner as the circuit shown in FIG. 1.

When either one of the memory cells in jth and j+1th columns is accessed, source line potential controlling circuit 8' applies ground potential Vss to source line SLk. Accordingly, potential difference VDD - Vss is applied to memory cells MCj and MCj+1 as a power supply voltage. In the embodiment shown in FIG. 12, potential difference VDD - Vss is applied to the memory cell in one column which is not accessed as a power supply voltage. However, it should be clear that the above mentioned advantage of less power consumption is also obtained in the column which is not accessed, since power consumed in the memory cell provided in one column is so small.

Figure 13:
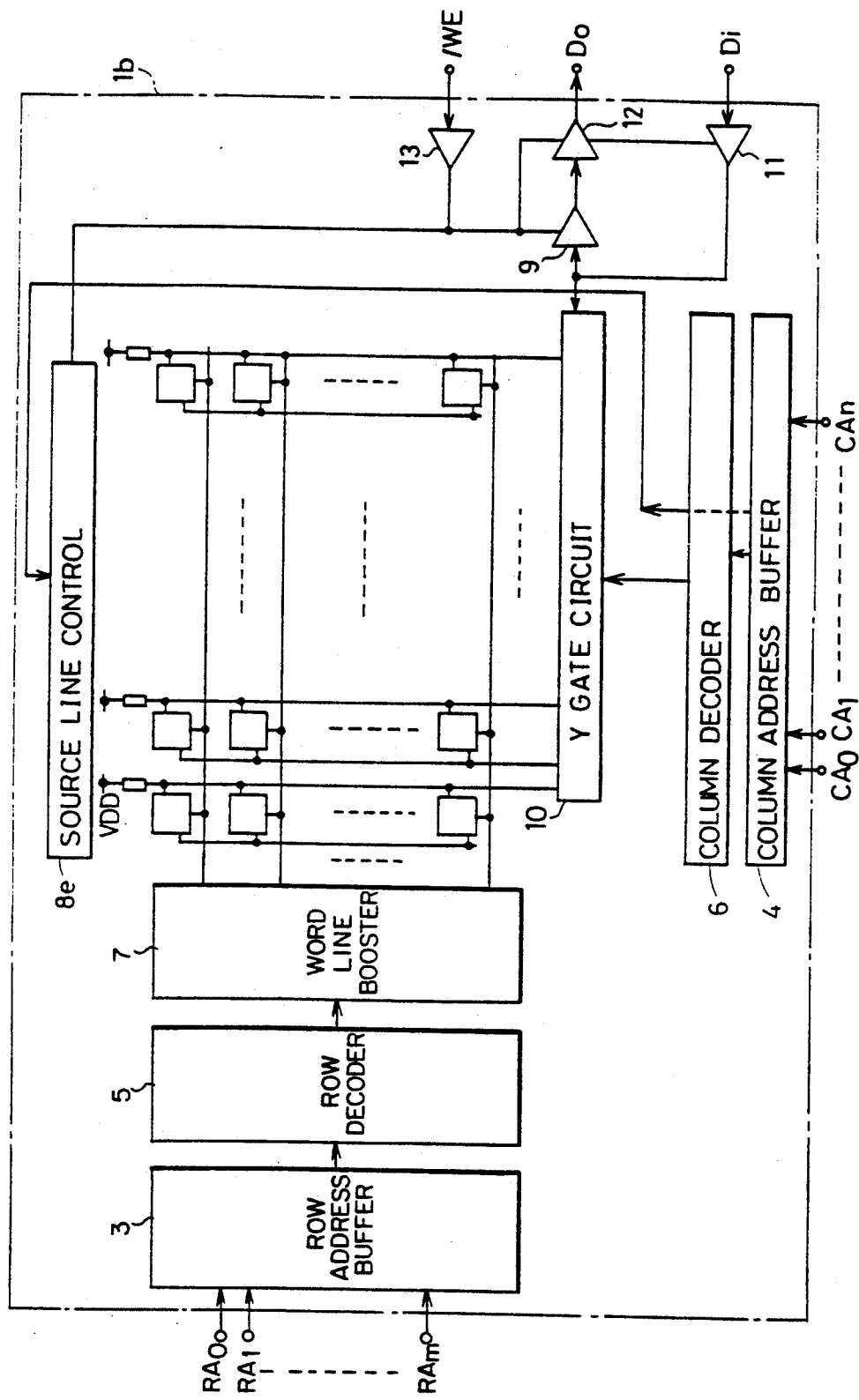
FIG. 13 is a block diagram of an SRAM showing yet another embodiment of the present invention.

FIG. 13 is a block diagram of an SRAM showing yet another embodiment of the present invention. Referring to FIG. 13, in a SRAM1b, the position of a source line controlling circuit 8e on the semiconductor substrate is different from the one in the SRAM1a shown in FIG. 2. That is, in SRAM1a shown in FIG. 2, a column decoder 6 and 9 source line potential controlling circuit 8 were provided on the same side with the memory cell array. However, in SRAM1b shown in FIG. 13, source line controlling circuit 8e is provided on the opposite side of the memory cell array. In other words, column decoder 6 and source line controlling circuit 8e are placed on the opposing positions with the memory cell array positioned in between on the semiconductor substrate. Therefore, SRAM1b shown in FIG. 13 has the following advantage in addition to the advantage of the SRAM1a shown in FIG. 2. In SRAM1a shown in FIG. 2, the source lines had to be provided through a Y gate circuit 10. That is, since the source lines had to be provided in a small region remained in Y gate circuit 10 of SRAM1a, the circuit had a complicated structure in the part. The circuitry design is assumed to be more and more difficult as the degree of integration is improved. The source lines do not penetrate Y gate circuit 10 since source line controlling circuit 8e is provided on the opposite side of the memory cell array as shown in FIG. 13. As a result, the problem described above can be prevented even when the degree of integration develops.

Figure 14:
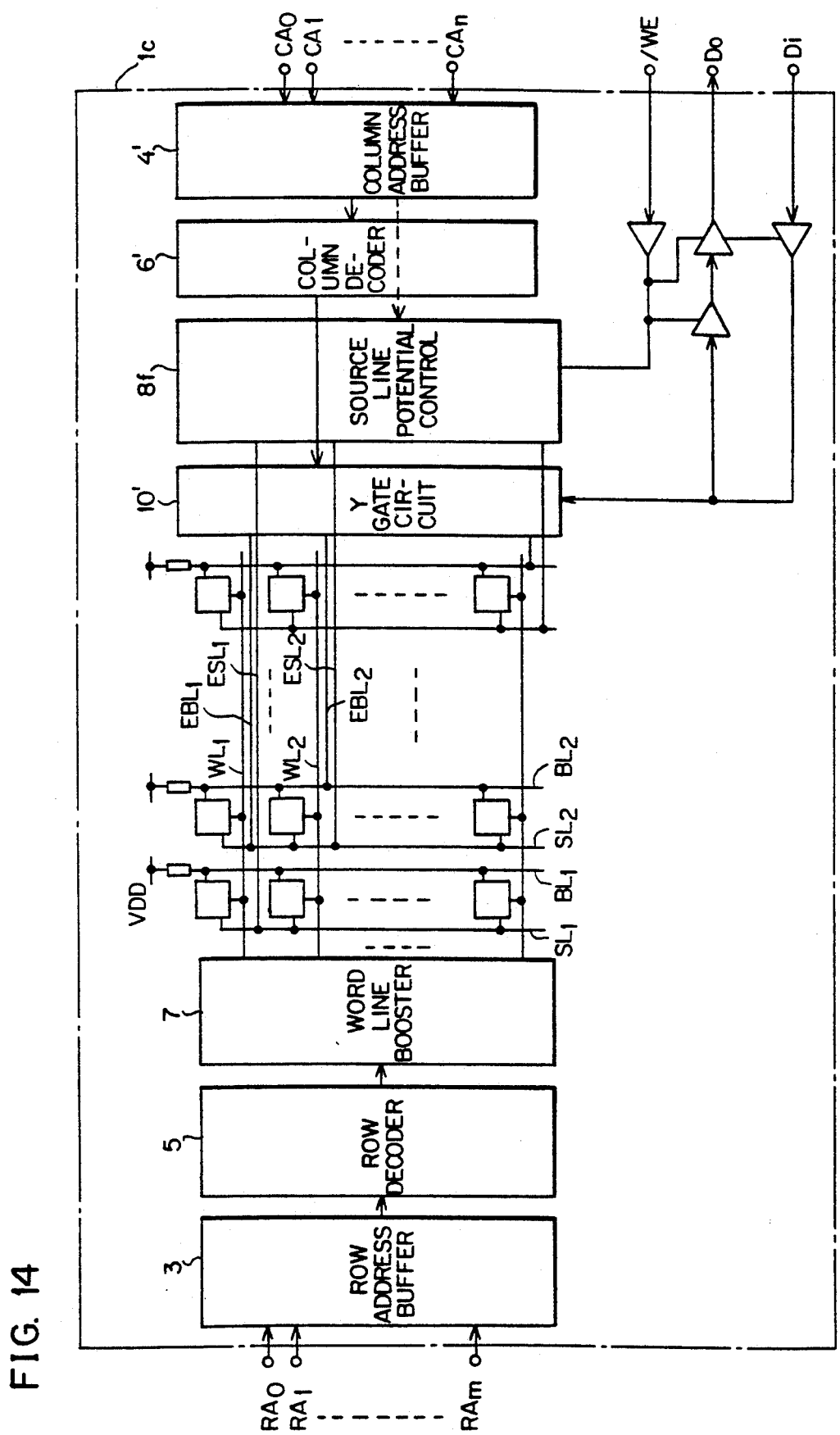
FIG. 14 is a block diagram of an SRAM showing yet another embodiment of the present invention.
Figure 15:
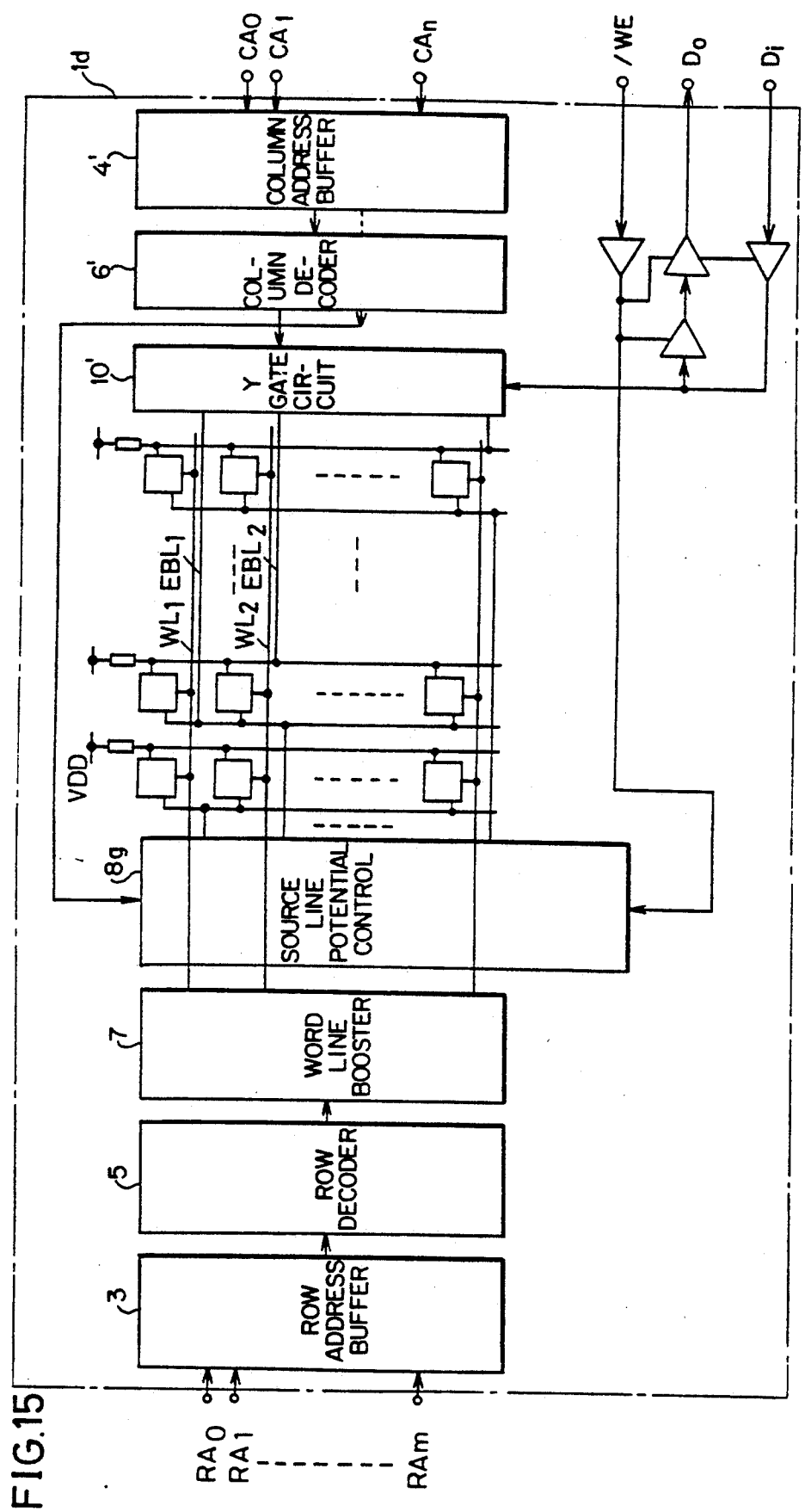
FIG. 15 is a block diagram of an SRAM showing yet another embodiment of the present invention.
Figure 16:
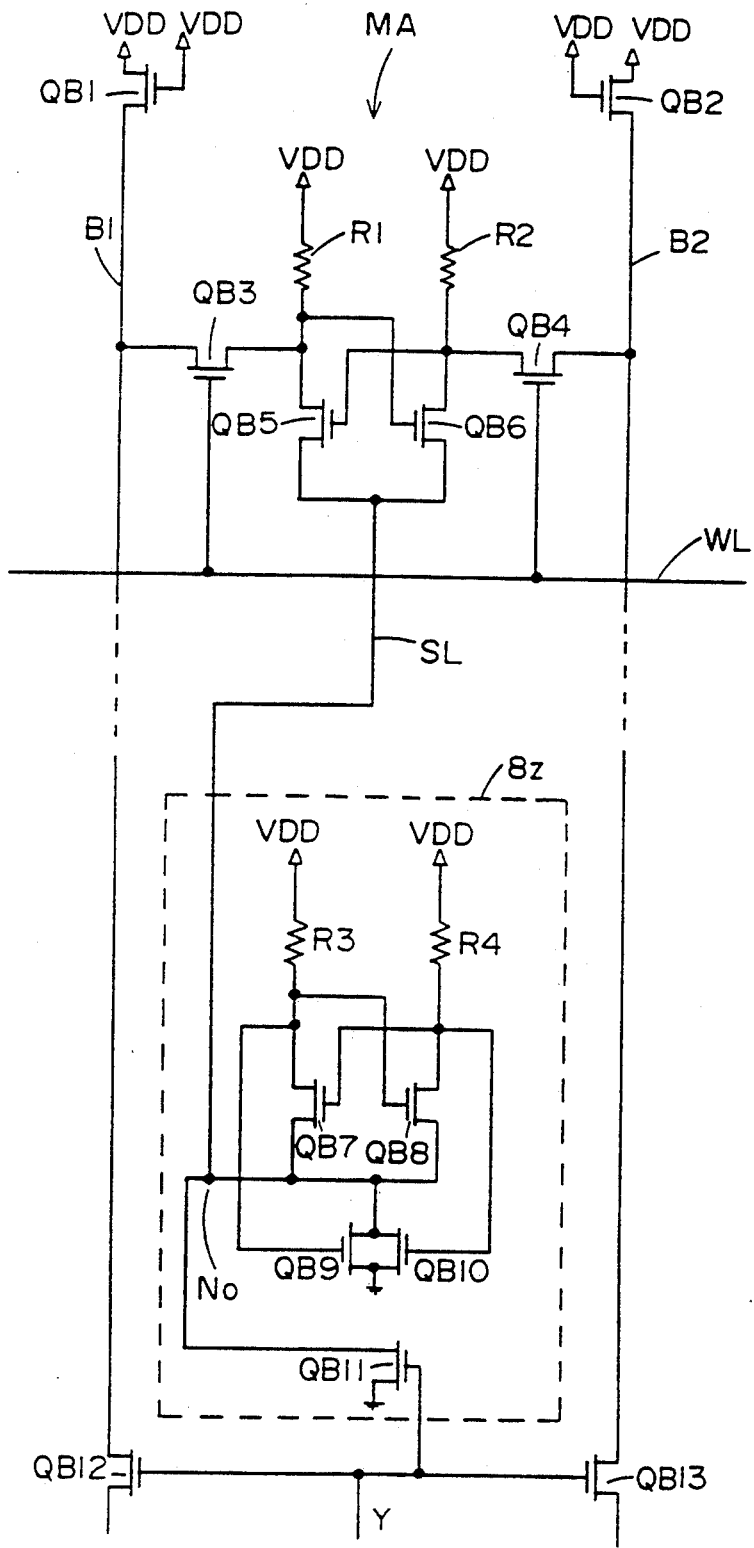
FIG. 16 is a circuit diagram of a memory cell circuit and a source line potential controlling circuit in a conventional SRAM.
Figure 17:
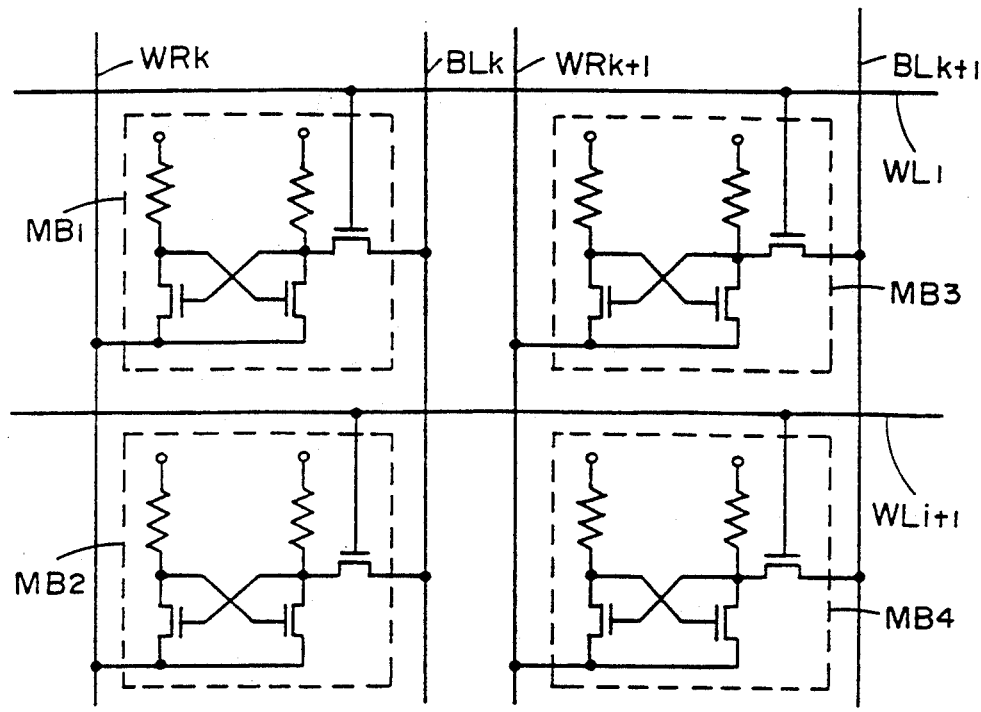
FIG. 17 is a circuit diagram of the conventional SRAM including the memory cells each constituted by five elements.
Figure 18:
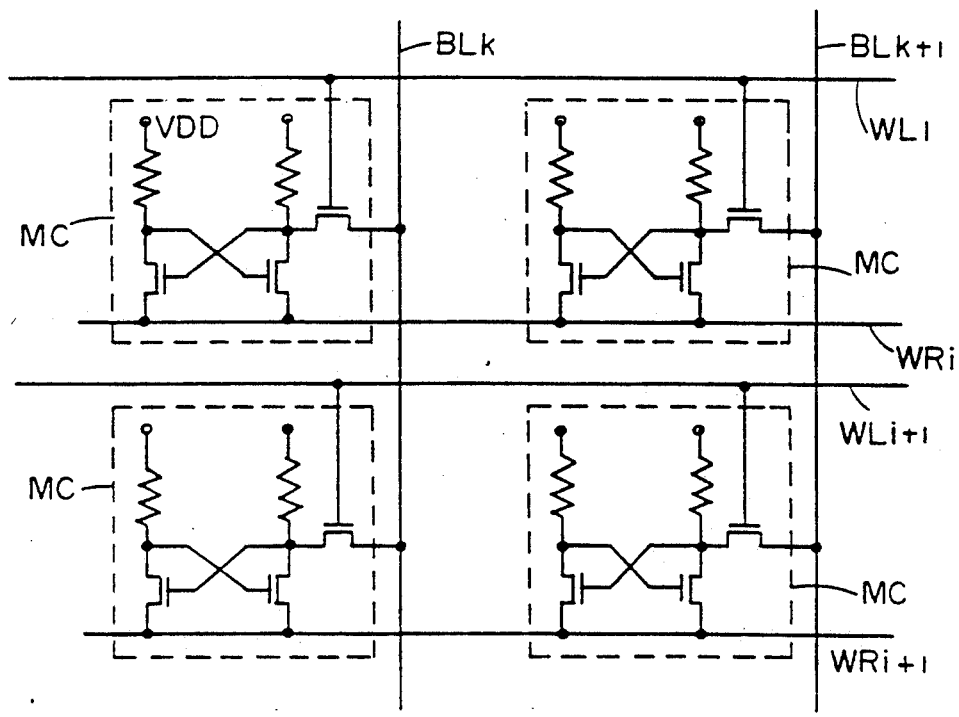
FIG. 18 is a circuit diagram showing another example of the conventional SRAM including the memory cells each constituted by five elements.
Figure 19:
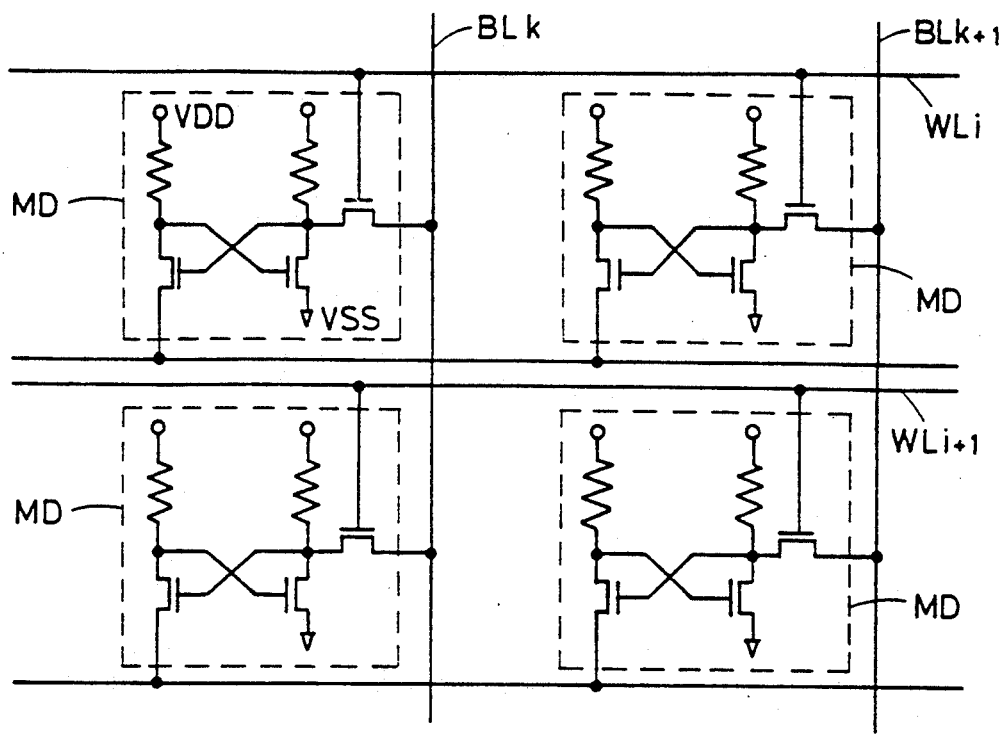
FIG. 19 is a circuit diagram showing yet another example of the conventional SRAM including memory cells each constituted by five elements.

FIG. 14 and 15 are block diagrams of SRAMs respectively showing further embodiments of the present invention. Generally, the semiconductor integrated circuit device such as SRAM is in a rectangular package. The rectangular package is often used for providing leads for input/output (or input/output pin) in the two opposing sides of the package. Therefore, the form of the semiconductor integrated circuit device in the rectangular package, namely, a semiconductor chip is preferred to be rectangular. This request can be satisfied by forming the circuit as shown in FIGS. 14 or 15.

Referring to FIG. 14, a SRAM1c includes a column address buffer 4', a column decoder 6', a source line potential controlling circuit 8f, and a Y gate circuit 10', all placed in the opposing positions of a row decoder 5 with the memory cell array positioned inbetween. Bit liens BL1, BL2, . . . provided in the column direction are connected to Y gate circuit 10' through extended bit lines EBL1, EBL2, . . . provided in the row direction. Similarly, source lines SL1, SL2, . . . provided in the column direction are connected to source line potential controlling circuit 8f through extended source lines ESL1, ESL2, . . . . SRAM1c shown in FIG. 14 has basically the same advantage as SRAM1a shown in FIG. 2. However, as mentioned above, SRAM1c has the advantage that it is more easily formed in the rectangular semiconductor chip. Furthermore, a SRAM1d shown in FIG. 15 has the following advantage.

Referring to FIG. 15, in a SRAM 1d, a source line potential controlling circuit 8g is placed in the opposing positions of a column decoder 6' with the memory cell array positioned inbetween in comparison with SRAM1c shown in FIG. 14. That is, source line potential controlling circuit 8g is provided on the same side with a row decoder 5. As can be seen from FIGS. 14 and 15, since interconnections in the row direction, i.e. word lines, extended bit lines, and extended source lines are less dense, it becomes possible to more easily keep up with the progress of the degree of integration.

Figure 7:
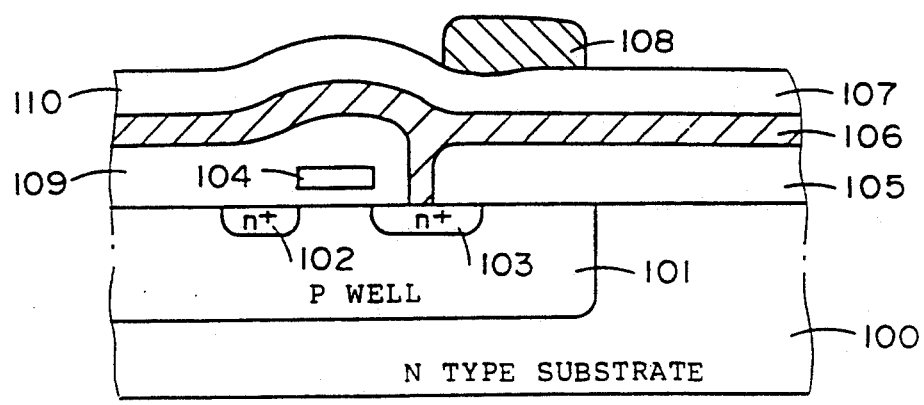
FIG. 7 is a cross sectional view of a structure of an interconnection employed in SRAMs shown in FIGS. 14 or 15.

FIG. 7 is a cross section of the interconnections utilized in SRAM1c or 1d shown in FIGS. 14 or 15. Referring to FIG. 7, a P well 101 is formed in a n type substrate 100. The source and the drain of an access transistor are formed by the n+ diffusion regions 102 and 103 formed in P well 101. The gate of the access transistor is formed by a polysilicon 104. A first aluminum interconnection 106 is formed on insulation layers 105 and 109 formed on substrate 100. Interconnection 106 is connected to n+ diffusion region 103 through a contact hole. A second aluminum interconnection layer 108 is formed on insulation layers 107 and 110 formed on first aluminum interconnection layer 106. Interconnection layer 108 is connected to first aluminum interconnection layer 106 through a through hole. In SRAMs 1c and 1d shown in FIGS. 14 and 15, bit lines and source lines provided in the column direction are formed by first aluminum interconnection layer 106. Word lines, extended bit lines, and extended source lines provided in the row direction are formed by second aluminum interconnection layer 108.

In the foregoing embodiments, word line boosting circuit 7 shown in detail in FIG. 8 is employed, and the following relation is required between the boosting levels of the word lines and the threshold voltages and/or mutual conductances of the transistors for implementing these embodiments.

Figure 21:
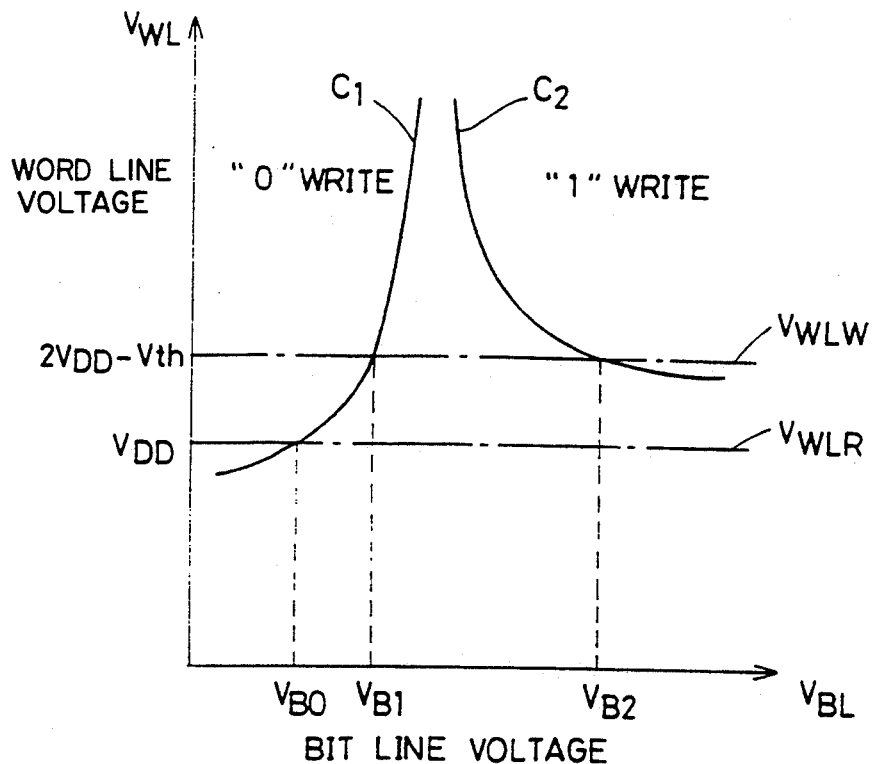
FIG. 21 is a graphic representation of electrical characteristics showing the relation between word line voltage and bit line voltage in embodiments employing a word line boosting circuit.

Referring to FIG. 21, the axis of ordinate represents the word line voltage $V_{WL}$, and the axis of abscissa represents the bit line voltage $V_{BL}$. Depending upon the relation between the word line voltage $V_{WL}$ and the bit line voltage $V_{BL}$, a data "0" write region delineated by a curve C1 and a data "1" write region delineated by a curve C2 exist. When a data writing operation into a memory cell is conducted, the word line voltage $V_{WL}$ is boosted to a boosting level $2V_{DD}$-$V_{th}$ indicated by line $V_{WLW}$. In addition, with the bit line voltage $V_{BL}$ being changed to a level lower than $V_{B1}$ (data "0" write) or a level higher than $V_{B2}$ (data "1" write), desired data may be written into the memory cell.

Meanwhile, when a data reading operation is conducted, the word line voltage $V_{WL}$ attains a power supply voltage level VDD indicated by line $V_{WLR}$. At that time, if the bit line voltage $V_{BL}$ is lower than the voltage level $V_{BO}$ shown in FIG. 21, writing of data "0" is induced in the reading operation. More specifically, the stored data is destroyed. In order to prevent such destruction of data in reading operation, circuit constants for transistors in the circuit shown in FIG. 1 are selected as follows.

Referring to FIG. 1, assume that the input/output node N1 of memory cell MC is pulled to a low level based on stored data. In other words, transistor Q2 is turned on in this state. In a reading operation, when the word line WL$_i$ attains the supply voltage level $V_{DD}$, transistor Q3 conducts. At that time, a source line SL$_j$ is brought to a ground potential VSS (=0V). Accordingly, in a period when the word line WL$_i$ is activated, a current path is formed by transistors Q4, Q3 and Q2 which are turned on between the power supply potential VDD and the ground potential VSS. If the total mutual conductance of transistors Q2 and Q3 is extremely lower than transistor Q4, the bit line voltage $V_{BL}$ becomes lower than $V_{BO}$ shown in FIG. 21 in a word line activation period. More specifically, data destruction is caused. Therefore, in order to prevent such data destruction, the mutual conductances (or the threshold voltages) of transistors Q2, Q3, and Q4 shown in FIG. 1 are determined so that the bit line voltage $V_{BL}$ is above $V_{BO}$ in the word line activation period in the embodiment shown in FIG. 1.

Figure 22:
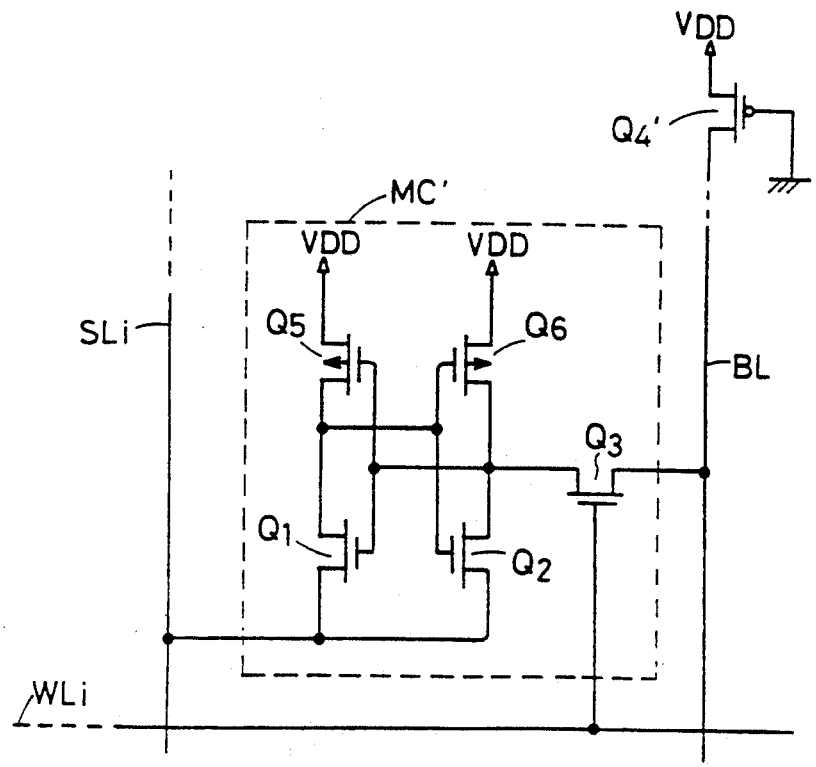
FIG. 22 is a circuit diagram showing a bit line load transistor having a grounded gate.

For example, in order to satisfy the above-stated requirement, the circuit shown in FIG. 1 is designed in such a manner that the threshold voltage of transistor Q4 becomes smaller than the threshold voltages of transistors Q2 and Q3. Alternatively, as shown in FIG. 22, a PMOS transistor Q4' having a grounded gate is used, instead of NMOS transistor Q4 shown in FIG. 1.

Although in all the embodiments described above, the cases have been described in which in data writing operation, the word line voltage $V_{WL}$ is boosted to be higher than the power supply voltage $V_{DD}$, a description of embodiments in which in data reading operation, the word line voltage $V_{WL}$ is reduced (or pulled down) as compared to the power supply voltage $V_{DD}$ follows.

Figure 23:
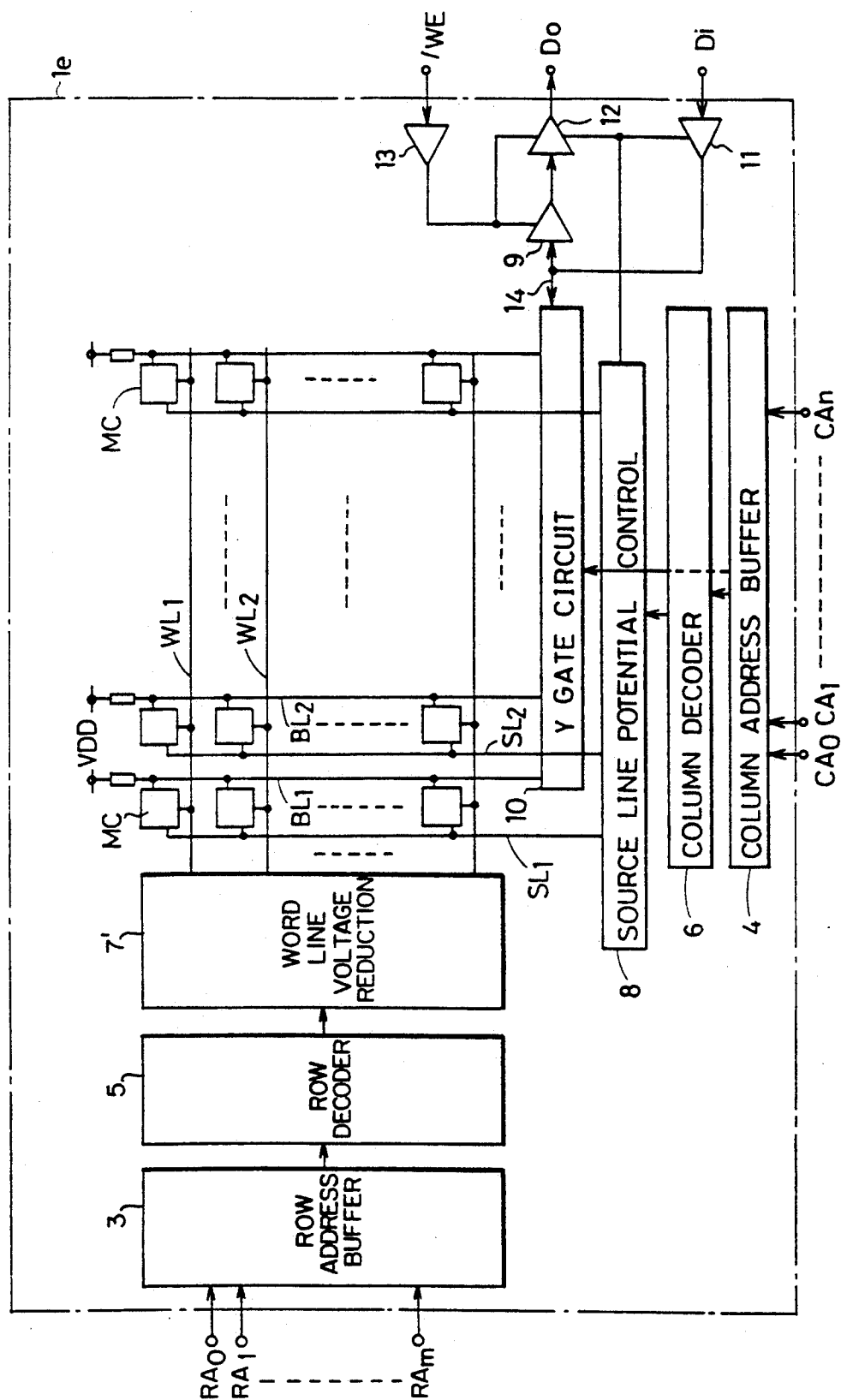
FIG. 23 is a block diagram showing an SRAM in accordance with yet another embodiment of the invention.

FIG. 23 is a block diagram showing an SRAM in accordance with yet another embodiment of the invention. Referring to FIG. 23, an SRAM le includes a word line voltage reducing circuit 7' rather than word line boosting circuit 7 as opposed to SRAM 1a shown in FIG. 2. Word line voltage reducing circuit 7', in a data writing operation, pulls a selected word line to a power supply voltage level $V_{DD}$ (3.0V, for example), while in a data reading operation pulls a selected word line to a reduced level $V_{DD}$-$V_{th}$ (1.5V, for example).

Figure 24:
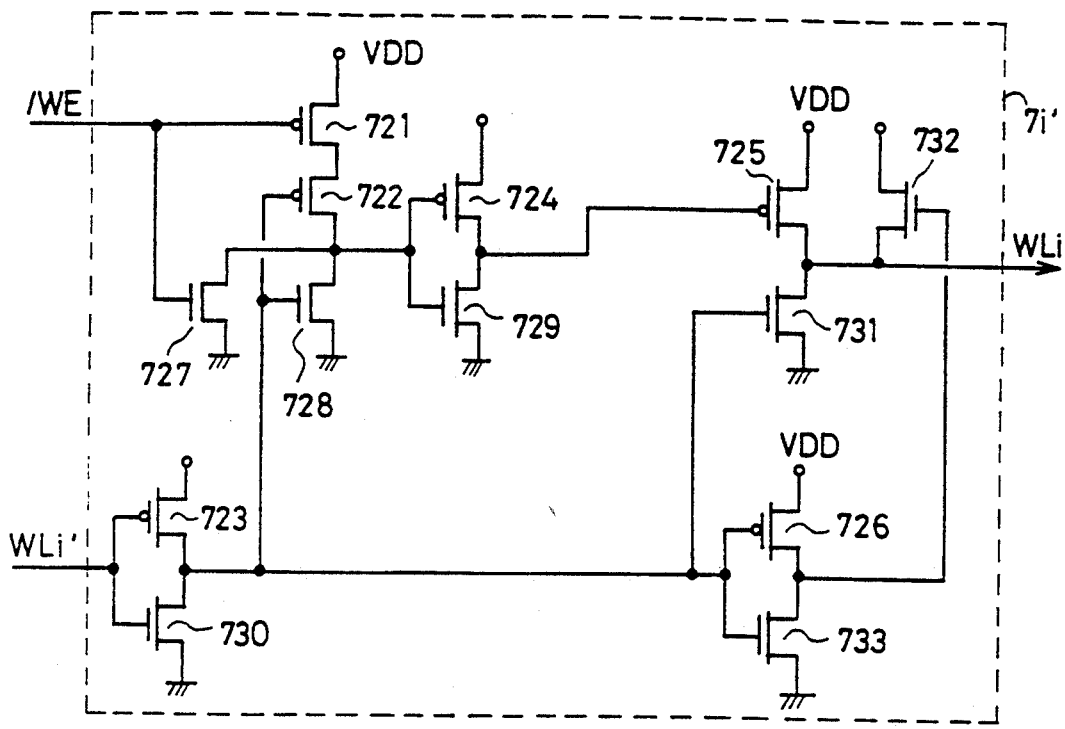
FIG. 24 is a partial circuit diagram showing a word line voltage reducing circuit 7' shown in FIG. 23.

FIG. 24 is a partial circuit diagram showing word line voltage reducing circuit 7' shown in FIG. 23. Reducing circuit 7i' shown in FIG. 24 is provided for controlling a voltage applied to the i-th word line WLi. Reducing circuit 7i' includes PMOS transistors 712 to 726, and NMOS transistors 727 to 733.

In a data writing operation, a low level signal /WE and a high level signal WLi' are applied. Transistors 721, 722, and 729 are turned on, which turns on transistor 725. Accordingly, a word line voltage WLi of power supply voltage level $V_{DD}$ is output through transistor 725. On the other hand, in a data reading operation, high level signals /WE and WLi' are applied. Transistors 727 and 724 are turned on, which turns off transistor 725. In addition, transistors 730 and 726 are turned on, which turns on transistor 732. Therefore, a reduced voltage $V_{DD}$ - $V_{th}$ ($V_{th}$ is the threshold voltage of transistor 732) is output as a word line voltage WLi through transistor 732.

Figure 25:
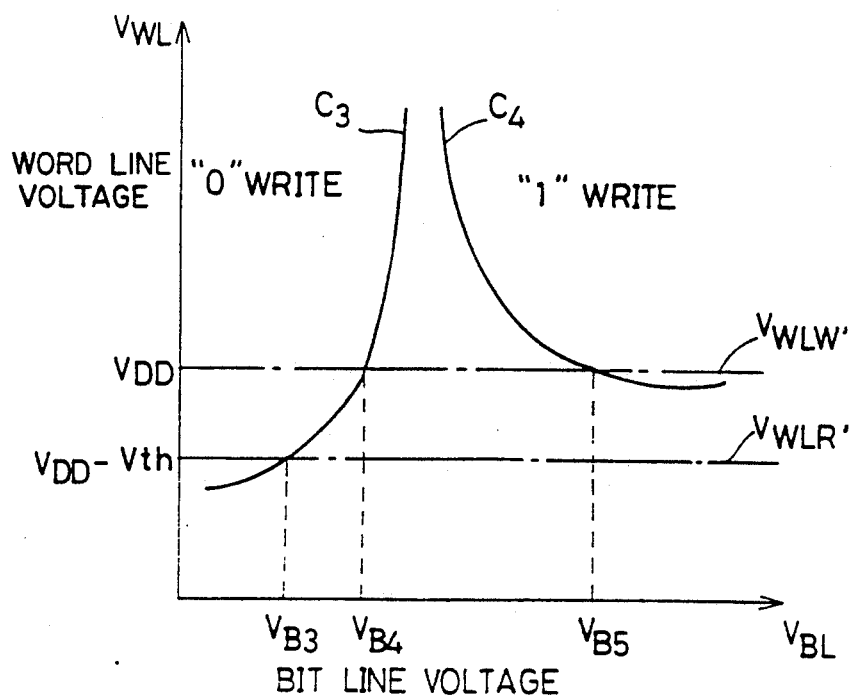
FIG. 25 is a graphic representation of electrical characteristics showing the relation between word line voltage and bit line voltage in an embodiment employing the word line voltage reducing circuit.

Referring to FIG. 25, a data "0" write region and a data "1" write region in SRAM le shown in FIG. 23 are delineated by curves C3 and C4, respectively. In a data writing operation, the word line voltage $V_{WL}$ attains a power supply voltage level $V_{DD}$ indicated by line $V_{WLW}'$. In addition, the bit line voltage $V_{BL}$ is changed to a level equal to or lower than $V_{B4}$ or equal to or higher than $V_{B5}$ and, therefore, data "0" or data "1" is written in the memory cell.

Meanwhile, in a data reading operation, the word line voltage $V_{WL}$ attains a reduced level $V_{DD}$- $V_{th}$ indicated by line $V_{WLR}'$. Also in this case, the circuit is designed in such a manner that the bit line voltage $V_{BL}$ is above the level $V_{B3}$ shown in FIG. 25 in a word line activated period, and data destruction in the data reading operation is therefore prevented.

In the foregoing, it has been described that word line voltage reducing circuit 7' may be applied instead of word line boosting circuit 7 in the embodiments in accordance with the invention. More specifically, as can be seen from FIGS. 21 and 25, boosting circuit 7 and reducing circuit 7' are provided for achieving effective data writing in data writing operation and for preventing undesirable data destruction in data reading operation.

Since the SRAM described above includes the memory cell circuit each constituted by five elements, its density has been improved. Additionally, since the power supply voltage applied to a memory transistor provided in the column which is not accessed is decreased, power consumption is decreased and, at the same time, the destruction of the gate oxide film in the access gate transistor caused as time passes can be prevented. Furthermore, measures have been taken for the problem of the layout which is assumed to be caused by the progress of the degree of integration (embodiment shown in FIGS. 13 and 15). There is also a suggestion for forming SRAM in a rectangular semiconductor chip (embodiments show in FIGS. 14 and 15).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static random access memory device, comprising:
    a memory cell array including a plurality of memory cells arranged in rows and columns;
    a plurality of bit lines each provided in corresponding one of said columns in said memory cell array and connected to the memory cells in said corresponding one of said columns;
    wherein each of said memory cells includes
        data storage means comprising output means having a single input/output node for storing a data signal applied through said input/output node,
        single switching means connected between the bit line in one corresponding column and said input/output node, which is made conductive in response to a row address signal,
        said data storage means being supplied with a controllable power supply voltage;
    said device further comprising
    power supply voltage decreasing means responsive to a column address signal for selectively decreasing to a predetermined voltage value said power supply voltage applied to the memory cells provided in at least one column which is not accessed.

2. The static random access memory according to claim 1, wherein said power supply voltage decreasing means includes:
    a plurality of controllable voltage supplying lines respectively provided along a plurality of columns in said memory cell array for respectively supplying said controllable power supply voltage to the memory cells in one corresponding column; and
    decreased voltage supplying means responsive to a column address signal for selectively supplying a decreased voltage having said predetermined voltage value to a controllable voltage supplying line provided in said at least one column which is not accessed.

3. The static random access memory device according to claim 2, wherein said power supply voltage decreasing means further includes a plurality of extended voltage supplying line respectively provided along the rows in said memory cell array, and respectively connected to said plurality of controllable voltage supplying lines,
    said decreased voltage supplying means applying said decreased voltage to said plurality of extended voltage supplying lines.

4. The static random access memory device according to claim 3,
    wherein said plurality of controllable voltage supplying lines and said plurality of extended voltage supplying lines are formed in two different interconnection layers.

5. The static random access memory device according to claim 2, further comprising:
    a semiconductor substrate having said memory cell array formed thereon; and
    column selection means responsive to a column address signal for selecting a column including a memory cell which is to be accessed; wherein
    said decreased voltage supplying means and column selection means are placed opposing to each other with said memory cell array positioned inbetween on said substrate.

6. The static random access memory device according to claim 5, further comprising:
    row selection means responsive to a row address signal for selecting a row including a memory cell which is to be accessed; wherein
    said row selection means and said column selection means are placed opposing to each other with said memory cell array positioned inbetween on said substrate.

7. The static random access memory device according to claim 6,
    wherein said row selection means includes two decoder means for decoding a row address signal to selectively activate one of said plurality of word line; and
    said column selection means includes column decoder means for decoding a column address signal to selectively provide a data signal on said plurality of bit lines.

8. The static random access memory device according to claim 1, wherein said power supply voltage decreasing means includes means responsive to a column address signal for selectively decreasing to said predetermined power supply voltage value said power supply voltage applied to the memory cells in at least one column which is not accessed and in another column next to it.

9. The static random access memory according to claim 1,
    wherein said data storage means includes two cross coupled inverter means applied with first and second power supply potentials as said power supply voltage; and
    said power supply voltage decreasing means includes power supply potential difference decreasing means responsive to said column address signal for selectively decreasing to said predetermined voltage value a difference between said first and second power supply potentials.

10. The static random access memory device according to claim 9,
    wherein said power supply potential difference decreasing means includes means responsive to said column address signal for changing by said predetermined voltage value one of said first and second power supply potentials to the other one of said first and second power supply potentials.

11. The static random access memory device according to claim 9,
    wherein said two cross coupled inverter means include two cross coupled NMOS inverter means.

12. The static random access memory device according to claim 9,
    wherein said two cross coupled inverter means include two cross coupled CMOS inverter means.

13. The static random access memory device according to claim 1, further comprising:
    a plurality of word lines each provided in corresponding one of said rows in said memory cell array and connected to a plurality of memory cells in said corresponding one of said rows; and
    row decoder means for decoding a row address signal to selectively activate one of said plurality of word lines;
    wherein said single switching means provided in each of the memory cells is turned on in response to a signal on the word line provided in one corresponding column.

14. The static random access memory device according to claim 13, further comprising,
   word line voltage control means connected between the outputs of said row decoder means and said plurality of word lines and responsive to an externally applied write enable signal for controlling the voltage of an activated word line.

15. The static random access memory device according to claim 14, wherein
   said word line voltage control means, in a data writing operation, changes the level of the voltage of the activated word line to a first predetermined voltage level suitable for data writing, and in a data reading operation, to a second predetermined voltage level at which data destruction is not caused.

16. The static random access memory device according to claim 15, wherein
   said word line voltage control means includes voltage boosting means responsive to an externally applied write enable signal for boosting the voltage of the activated word line to said first predetermined voltage level.

17. The static random access memory according to claim 16, wherein
   said voltage boosting means includes,
   boosted voltage generation means responsive to an externally applied write enable signal for generating a boosted voltage higher than a power supply voltage level,
   transmission means responsive to an output signal from said row decoder means for transmitting the boosted voltage, and
   switching means responsive to the write enable signal for selectively outputting one of the boosted voltage applied from said transmission means and the power supply voltage.

18. The static random access memory according to claim 15, wherein
   said word line voltage control means includes voltage reducing means responsive to an externally applied write enable signal for reducing the voltage of the activated word line to said second predetermined voltage level.

19. The static random access memory device according to claim 1, wherein
   said power supply decreasing means comprises:
   address decoding means for supplying a control signal in response to an address signal;
   an invertor receiving said control signal and supplying an invertor signal; and
   a series connection of first and second field effect devices receiving a power signal and, responsive to said inverted signal, for selectively supplying said predetermined voltage value.

20. The static random access memory device according to claim 19, wherein
   said first field effect device has a commonly connected drain and control gate receiving said power signal and said inverted signal is supplied to a control gate of said second field effect device.

21. The static random access memory device according to claim 1, wherein
   said power supply decreasing means comprises:
   a series connection of a plurality of first field effect devices, each having a control gate for receiving a respective address signal; and
   a second field effect device having commonly connected drain and gate terminals receiving a power supply signal and a source terminal connected to said series connection of said first field effect devices.

22. A static random access memory, comprising:
   a single bit line provided along one column; and
   a plurality of memory cells each connected to said single bit line;
   wherein each of said memory cells includes
     data storage means having a single input/output node for storing a data signal applied through said input/output node,
     single switching means connected between said single bit line and input/output node, which is turned on in response to a row address signal,
     said data storage means being supplied with a controllable power supply voltage;
   said memory further comprising
   non-selection column detecting means responsive to a column address signal for detecting non-selection of said one column, and
   power supply voltage decreasing means responsive to said non-selection detecting means for decreasing said power supply voltage to a predetermined voltage value.

23. A semiconductor memory device, comprising:
   a plurality of bit lines and source lines arranged in columns;
   a plurality of word lines arranged in rows;
   a plurality of memory cells arranged at respective crossings of said bit lines and word lines, each of said memory cells including:
   (i) data storage means including data input/output means comprising a single input/output node for storing data, said data storage means connected to a corresponding one of said source lines for receiving a source potential, and
   (ii) switching means connected between a bit line in a corresponding column and said input/output node and responsive to an address signal on a corresponding one of said word lines for storing data in, and reading data from respective data storage means;
   word line control means responsive to said address signal and to a read/write control signal for supplying a word line signal to said word lines; and
   source line control means responsive to said address signal for supplying a source line potential to said source lines.

24. A static random access memory device, comprising:
   a plurality of single bit lines arranged in columns;
   a plurality of word lines arranged in rows;
   a plurality of memory cells arranged in rows and columns,
   each memory cell having
   (i) a first driver transistor connected between a data storage node and a source node, the control electrode of said first driver transistor connected to a first node,
   (ii) a second driver transistor connected between said first node and said source node, the control electrode of said second driver transistor connected to said data storage node,
   (iii) a first load element connected between a power supply potential and said storage node, (iv) a second load element connected between said power supply potential node and said first node, and (v) a transfer transistor connected between said data storage node and the single bit line arranged in the corresponding column, the control electrode of said transfer transistor connected to the word line arranged in the corresponding row;

a word line decoder for selecting one of said plurality of word lines and having a plurality of word line decoder parts arranged in rows, each word line decoder part responsive to a row address signal for outputting a first level potential at the time of select and a second level potential at the time of non-select;

a plurality of word line potential supply means arranged in rows, each word line potential supply means responsive to a read/write signal and an output signal of the word line decoder parts arranged in the corresponding row for outputting a third level potential to the corresponding word line when the outputting of the corresponding word line decoder part is the first level potential and said read/write signal designate read, a fourth level potential higher than said third level potential to the corresponding word line when the output of the corresponding word line decoder part is first level potential and said read/write signal designated write, and a fifth level potential to the corresponding word line when the output of the corresponding word line decoder part is second level potential.

25. The static random access memory device according to claim 24, further comprising:

a plurality of source lines arranged in columns, each source line connected to source nodes of said plurality of memory cells arranged in the corresponding columns.

26. The static random access memory device according to claim 25, further comprising:

a source line potential supply means for applying a seventh level potential to the source line corresponding to the bit line selected and an eighth level potential to the source lines corresponding to the bit lines non-selected.

* * * * *